(12) United States Patent
Yamamoto et al.

(10) Patent No.: US 8,393,808 B2
(45) Date of Patent: Mar. 12, 2013

(54) DEVELOPING METHOD

(75) Inventors: Taro Yamamoto, Koshi (JP); Kousuke Yoshihara, Koshi (JP); Yuichi Yoshida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 488 days.

(21) Appl. No.: 12/710,510

(22) Filed: Feb. 23, 2010

(65) Prior Publication Data

US 2010/0216078 A1    Aug. 26, 2010

(30) Foreign Application Priority Data

Feb. 25, 2009    (JP) .................................. 2009-043136

(51) Int. Cl.
*G03D 5/00*    (2006.01)
(52) U.S. Cl. ...................................................... 396/611
(58) Field of Classification Search .................... 396/611
See application file for complete search history.

(56) References Cited

U.S. PATENT DOCUMENTS

| | | | | |
|---|---|---|---|---|
| 3,953,265 A | * | 4/1976 | Hood | 438/8 |
| 5,678,116 A | * | 10/1997 | Sugimoto et al. | 396/611 |
| 5,893,004 A | * | 4/1999 | Yamamura | 396/611 |
| 6,371,667 B1 | * | 4/2002 | Kitano et al. | 396/611 |
| 6,550,990 B2 | * | 4/2003 | Sakurai et al. | 396/604 |
| 6,817,790 B2 | * | 11/2004 | Toshima et al. | 396/604 |
| 7,806,989 B2 | * | 10/2010 | Sekiguchi et al. | 134/30 |
| 2007/0183775 A1 | * | 8/2007 | Mitsuhashi et al. | 396/611 |
| 2009/0130614 A1 | | 5/2009 | Ookouchi et al. | |

FOREIGN PATENT DOCUMENTS

JP    2005-210059    8/2005

* cited by examiner

*Primary Examiner* — Rodney Fuller

(74) *Attorney, Agent, or Firm* — Burr & Brown

(57) ABSTRACT

A method of developing a substrate including rotating the substrate and supplying a developing liquid from a discharge port of a developer nozzle onto the surface of the substrate, while moving the developer nozzle, disposed above the substrate, from a central portion towards a peripheral portion of the substrate, and supplying a first rinse liquid from a discharge port of a first rinse nozzle onto the surface of the substrate, while moving the first rinse nozzle, disposed above the substrate, from the central portion towards the peripheral portion of the substrate. The supplying of the developing liquid and the first rinse liquid are performed concurrently, with the first rinse nozzle being maintained nearer to a center of the substrate than the developer nozzle.

20 Claims, 12 Drawing Sheets

DEVELOPING METHOD

TECHNICAL FIELD

The present invention relates to a developing method that develops a substrate which has a surface coated with a resist having been exposed, and more specifically to a developing method for developing a substrate when forming a fine pattern on a substrate such as a semiconductor wafer.

BACKGROUND ART

In manufacturing of a semiconductor device, a circuit pattern is formed by a so-called lithography process that forms a predetermined film on a wafer which is a substrate to be processed, then forms a resist film by coating a resist solution, then exposes the resist film with a pattern corresponding to the circuit pattern, and thereafter develops the exposed resist film. In such a lithography process, the wafer is mainly subjected to process steps including a cleaning step, a dehydrating-baking step, an adhesion (hydrophobizing) step, a resist coating step, a pre-baking step, an exposure step, a developing step and a post-baking step, which are performed in that order, whereby a predetermined fine pattern is formed in the resist film.

Known developing methods includes a so-called puddle (stationary) developing method that develops a wafer while a puddle of a developing liquid is formed on the wafer surface. In the puddle developing method, since the resist film is water-repellent and has high surface tension in general, if the amount of the developing liquid is insufficient, there may occur a pull-back phenomenon in which an aggregation of the developing liquid is pulled into another aggregation of the developing liquid, whereby areas which are not wetted with developing liquid (i.e., non-developed areas) may exist in the wafer surface. Thus, a relatively large amount of developing liquid must be supplied on the wafer surface such that the whole surface of the wafer is covered with the developing liquid, resulting in larger consumption of the developing liquid.

Known developing methods also include a so-called puddle-less (rotating) developing method that rotates a wafer about a vertical axis and moves a developing nozzle from the center toward the periphery of the wafer while the developing nozzle supplies a strip-shaped developing liquid whose width extends in the radial direction of the wafer, whereby the wafer surface is coated with the developing liquid in a spiral form. In this puddle-less developing method, dissolved components of the resist is removed together with the developing liquid spreading radially due to the centrifugal force. Thereafter, a rinse liquid such as deionized water is supplied to the center of the wafer. As a result, the parts of the resist which are not soluble in the developing liquid remain on the wafer, and thus the predetermined resist pattern is obtained (See JP2005-210059A, for example.).

In general, the puddle-less method can reduce the developing time and the resist-liquid consumption as compared with the puddle method.

However, even though the puddle-less method is employed, in some cases, it is still difficult to satisfy both of the process margin (or process performance) and the process economy (i.e., shorter processing time, less developing liquid consumption). Herein, the process margin refers to the difference of an actual value of a parameter for evaluating the result of the process from the allowable limit value of the parameter, where the parameter may be, for example, in-plane uniformity of the CD value, the amount of defects formed due to re-adhesion of components dissolved in the developing liquid.

Specifically, in a case where a substrate, having thereon a resist protection film used in an ArF immersion lithography or having thereon a water-repellent resist film, is developed, such a highly water-repellent surface repels a developing liquid or a rinse liquid, which may result in deteriorated process efficiency of a developing process or a rinse process. Thus, the processing time (developing time) or the amount of the processing liquid must be increased in order to achieve sufficient process performance.

SUMMARY OF THE INVENTION

The present invention provides a developing method that is capable of achieving high in-plane uniformity of the CD value, reducing defects formed due to re-adhesion of components dissolved in the developing liquid, and achieving a shorter processing time, even in a case where a substrate a coated with any sort of films, including a resist protection film for immersion lithography, and a water-repellent resist film.

The present invention provides a developing method that develops a substrate, which has a surface coated with a resist having been exposed, while the substrate is held horizontally and is rotating about a vertical axis, the method including: supplying a developing liquid from a discharge port of a developer nozzle onto the surface of the substrate, while moving the developer nozzle, disposed above the substrate, from a central portion of the substrate toward a peripheral portion of the substrate; and supplying a first rinse liquid from a discharge port of a first rinse nozzle onto the surface of the substrate, while moving the first rinse nozzle, disposed above the substrate, from the central portion of the substrate toward the peripheral portion of the substrate; wherein the supplying of the developing liquid and the supplying the first rinse liquid are performed concurrently, while the first rinse nozzle is maintained nearer to a center of the substrate than the developer nozzle.

In one preferred embodiment, the method further includes jetting a gas from a discharge port of a gas nozzle onto the surface of the substrate, while moving the gas nozzle, disposed above the substrate, from the central portion of the substrate toward the peripheral portion of the substrate, wherein the jetting of the gas and the supplying the first rinse liquid are performed concurrently, while the gas nozzle is maintained nearer to the center of the substrate than the first rinse nozzle.

In one preferred embodiment, the method further includes supplying a second rinse liquid from a discharge port of a second rinse nozzle onto the surface of the substrate, while moving the second rinse nozzle, disposed above the substrate, from the central portion of the substrate toward the peripheral portion of the substrate, wherein the supplying of the developing liquid and the supplying the second rinse liquid are performed concurrently, while the developer nozzle is maintained nearer to the center of the substrate than the second rinse nozzle.

In one preferred embodiment, the first rinse nozzle and the developer nozzle move as a unit.

In one preferred embodiment, the gas nozzle and the first rinse nozzle move as a unit.

In one preferred embodiment, the developer nozzle and the second rinse nozzle move as a unit.

In one preferred embodiment, the moving velocity of the developer nozzle decreases as the developer nozzle approaches a periphery of the substrate.

In one preferred embodiment, a vector indicating a direction in which the developing liquid is discharged from the developer nozzle has a component whose direction is the same as a rotation direction of the substrate.

DETAILED DESCRIPTION OF THE INVENTION

An embodiment for carrying out the present invention will be described with reference to the attached drawings. First, one embodiment of the developing method according to the present invention will be described.

The below described embodiment of the developing method according to the present invention is a developing method that develops a substrate, which has a surface coated with a resist having been exposed, while the substrate is held horizontally and is rotated about a vertical axis, wherein the method includes:

a pre-wet liquid supplying step that supplies a pre-wet liquid from a discharge port of a pre-wet nozzle onto the surface of the substrate, while moving the pre-wet nozzle, disposed above the substrate, from the central portion of the substrate toward the peripheral portion of the substrate;

a developing liquid supplying step that supplies a developing liquid from a discharge port of a developer nozzle onto the surface of the substrate, while moving the developer nozzle, disposed above the substrate, from a central portion of the substrate toward a peripheral portion of the substrate; and a DIW supplying step that supplies DIW (deionized water) from a discharge port of a DIW nozzle onto the surface of the substrate, while moving the DIW nozzle, disposed above the substrate, from the central portion of the substrate toward the peripheral portion of the substrate; and a gas jetting step that jets a gas from a discharge port of a gas nozzle onto the surface of the substrate, while moving the gas nozzle, disposed above the substrate, from the central portion of the substrate toward the peripheral portion of the substrate, wherein:

the pre-wet liquid supplying step and the developing liquid supplying step are performed concurrently while the developer nozzle is maintained nearer to a center of the substrate than the pre-wet nozzle;

the DIW supplying step and the developing liquid supplying step are performed concurrently while the DIW nozzle is maintained nearer to a center of the substrate than the developer nozzle; and the gas jetting step and the DIW supplying step are performed concurrently while the gas nozzle is maintained nearer to a center of the substrate than the DIW nozzle.

It should be noted that the pre-wet liquid (pre-wet liquid nozzle) may be referred to as a second rinse liquid (second rinse nozzle), and DIW (DIW nozzle) may be referred to as a first rinse liquid (first rinse nozzle).

The developing method in this embodiment is capable of reducing the developing time, by performing the pre-wet liquid supplying step, the developing liquid supplying step, the DIW supplying step, and the gas jetting step concurrently.

Next, a concrete example of the developing method in this embodiment will be described. A developing apparatus used for carrying out the developing method in this embodiment will explained as the concrete example of the developing method in this embodiment, with reference to FIGS. 1 and 2.

Figure 1:
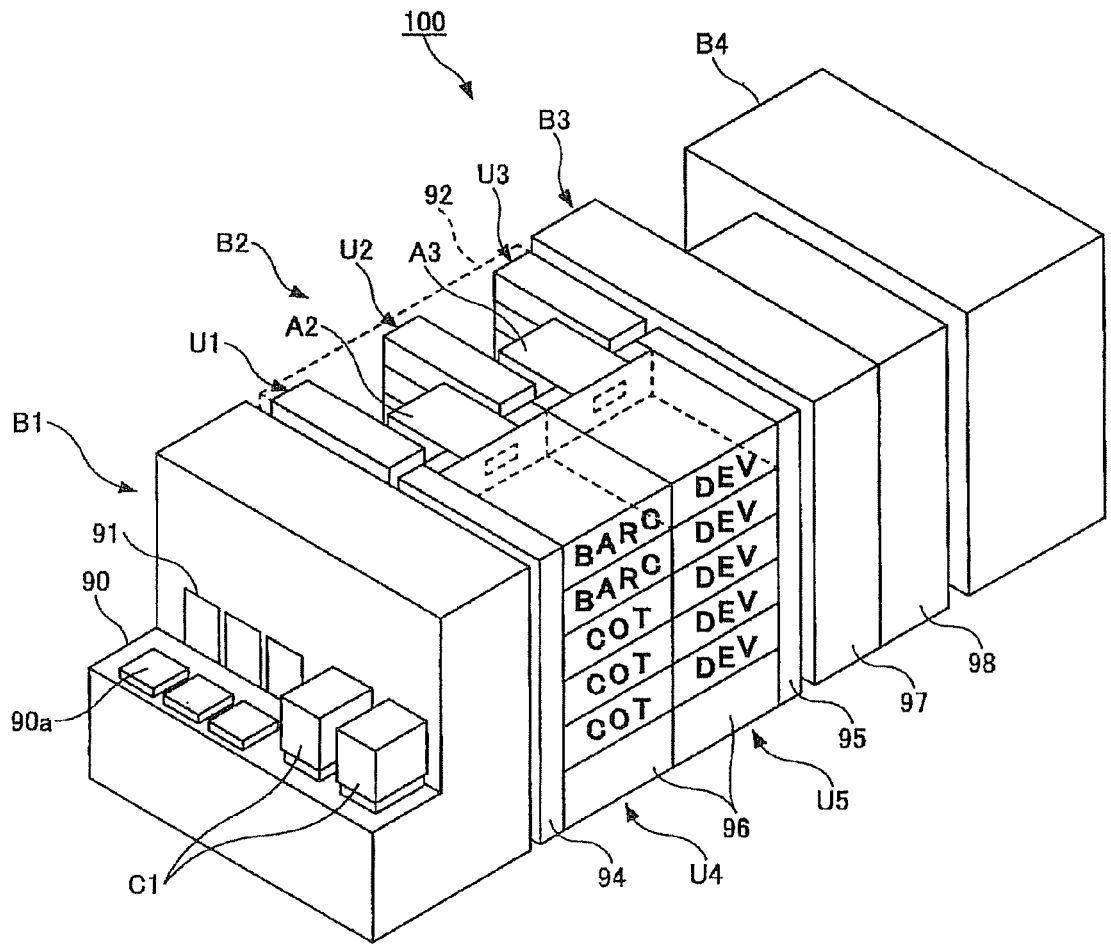
FIG. 1 is a perspective view showing the whole structure of a coating and developing system including a developing apparatus used for carrying out a developing method in one embodiment of the present invention.
Figure 2:
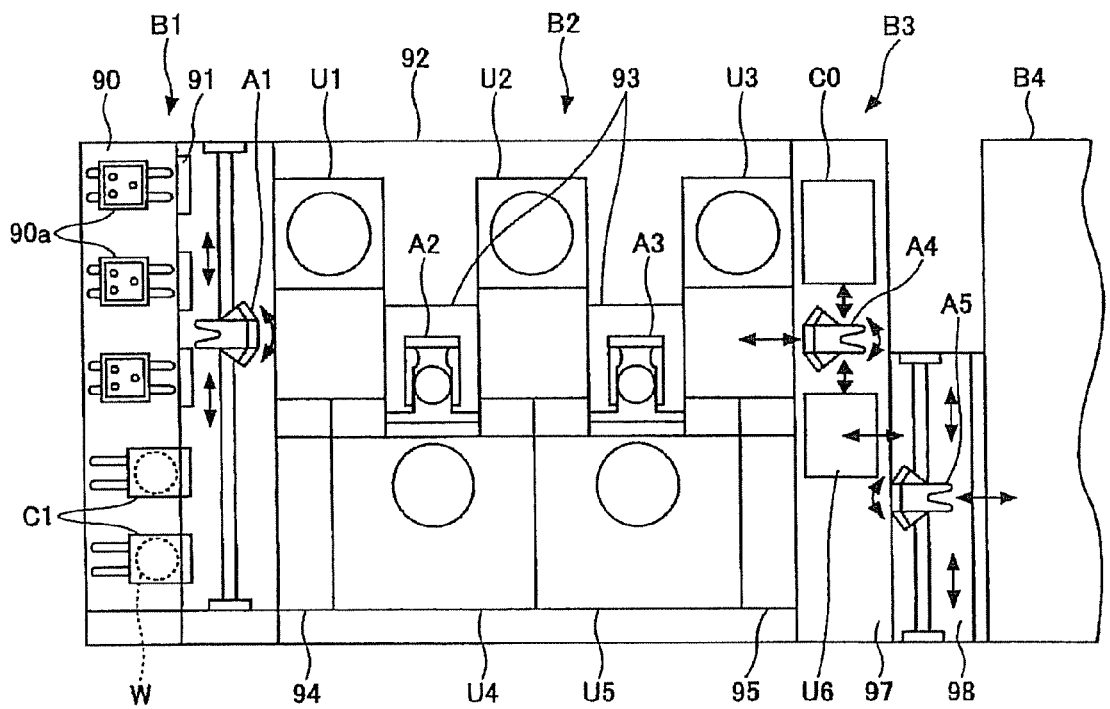
FIG. 2 is a top plan view showing the whole structure of the coating and developing apparatus used for carrying out the developing method in one embodiment of the present invention.

FIG. 1 is a perspective view showing the whole structure of a coating and developing system including a developing apparatus used for carrying out the developing method in this embodiment, and FIG. 2 is a top plan view thereof.

As shown in FIGS. 1 and 2, the coating and developing apparatus 100 includes a carrier stage section B1, a processing section B2, an interface section B3, and so on, and is installed adjacently to an exposure section B4 which is an external apparatus.

Through the carrier stage section B1, a carrier C1 hermetically accommodating a plurality of, e.g., thirteen wafers W as substrates can be loaded and unloaded. The carrier stage section B1 includes: a carrier station 90 having a stage 90a on which the carrier C can be placed; an opening and closing part 91 formed in a surface in front of the carrier station 90; and a transfer means A1 for taking out the wafers W from the carrier C1 through the opening and closing part 91.

The processing section B2, which is surrounded by a housing 92, is connected to a rear side of the carrier stage section B1. The processing section 82 includes shelf units U1, U2 and U3 which are formed by stacking heating and cooling units, and main transfer means A2 and A3 which are alternately disposed, for transferring wafers W among respective processing units including the below-described coating and developing unit, in this order from the front. The shelf units U1, U2 and U3, and the main transfer means A2 and A3 are linearly arranged in a fore and aft direction, when viewed from the carrier stage section B1. Formed in respective connection parts between the shelf units U1, U2 and U3, and the main transfer means A2 and A3 are openings, not shown, through which a wafer can be transferred. Thus, a wafer W can freely move inside the processing section B2 from the shelf unit U1 positioned on one end to the shelf unit U3 positioned on the other end.

Each of the main transfer means A2 and A3 are located in a space surrounded by partition walls 93 comprising: walls on the sides of the shelf units U1, U2 and U3 arranged in the fore and aft direction when viewed from the carrier stage section B1; a wall on the side of the below-described right liquid processing units U4 and U5, for example; and a rear wall on the left side.

Temperature and humidity regulating units 94 and 95 are respectively provided with an apparatus for regulating a temperature of the process liquid used in the respective units and a duct for regulating a humidity of the process liquid.

As shown in FIG. 1, for example, each of the liquid processing units U4 and U5 has a structure in which a coating unit COT, a developing unit DEV as the developing apparatus for carrying out the developing method in this embodiment, and an anti-reflection film forming unit BARC are stacked at a plurality of, e.g., five levels, on a storage part 96 serving as a space for storing a chemical liquid to be supplied, such as a coating liquid (resist liquid) and a developing liquid. Each of the aforementioned shelf units U1, U2 and U3 has a structure in which various units, which are configured to perform pre-processes and post-processes of processes performed by the liquid processing units U4 and U5, are stacked at a plurality of, e.g., ten levels. The shelf units U1, U2 and U3 include a heating unit for heating (baking) a wafer W, a cooling unit for cooling a wafer W, and so on.

The exposure section B4 is connected to the processing section B2 via the interface section B3 including, for example, a first transfer chamber 97 and a second transfer chamber 98. As shown in FIG. 2, disposed inside the interface section B3 are two transfer means A4 and A5 adapted to convey a wafer W between the processing section B2 and the exposure section B4, a shelf unit U6, and a buffer carrier C0.

One example of a flow of a wafer W in this system is as follows. First, the carrier C1 accommodating a wafer W is loaded from outside and placed on the stage 90a. Then, the opening and closing part 91 and a lid member of the carrier C1 are opened, and the wafer W is taken out by the transfer means A1. Then, the wafer W is transferred to the main transfer means A2 via a conveying unit (not shown) serving as one of the levels of the shelf unit U1. Then, the wafer W is subjected to, e.g., an adhesion (hydrophobizing) process and a cooling process, which are pre-process of a coating process, in one of the shelves of the shelf units U1 to U3. Thereafter, the wafer W is coated with a resist liquid in the coating unit COT.

Following thereto, the wafer W is subjected to a heating (baking) process in the heating unit forming one of the shelves of the shelf units U1 to U3, and is further subjected to a cooling process. Then, the wafer W is loaded into the interface section B3 via the conveying unit of the shelf unit U3. In the interface section B3, the wafer W is transferred to the exposure section B4 along a rout from, for example, the transfer means A4, the shelf unit U6, to the transfer means A5, in this order, and is then exposed. After the exposure process, the wafer W is transferred to the main transfer means A3 along the reverse route, and is developed in the developing unit DEV, whereby a resist mask is formed on the wafer W. After that, the wafer W is returned to the original carrier C1 placed on the stage 90a.

Figure 3:
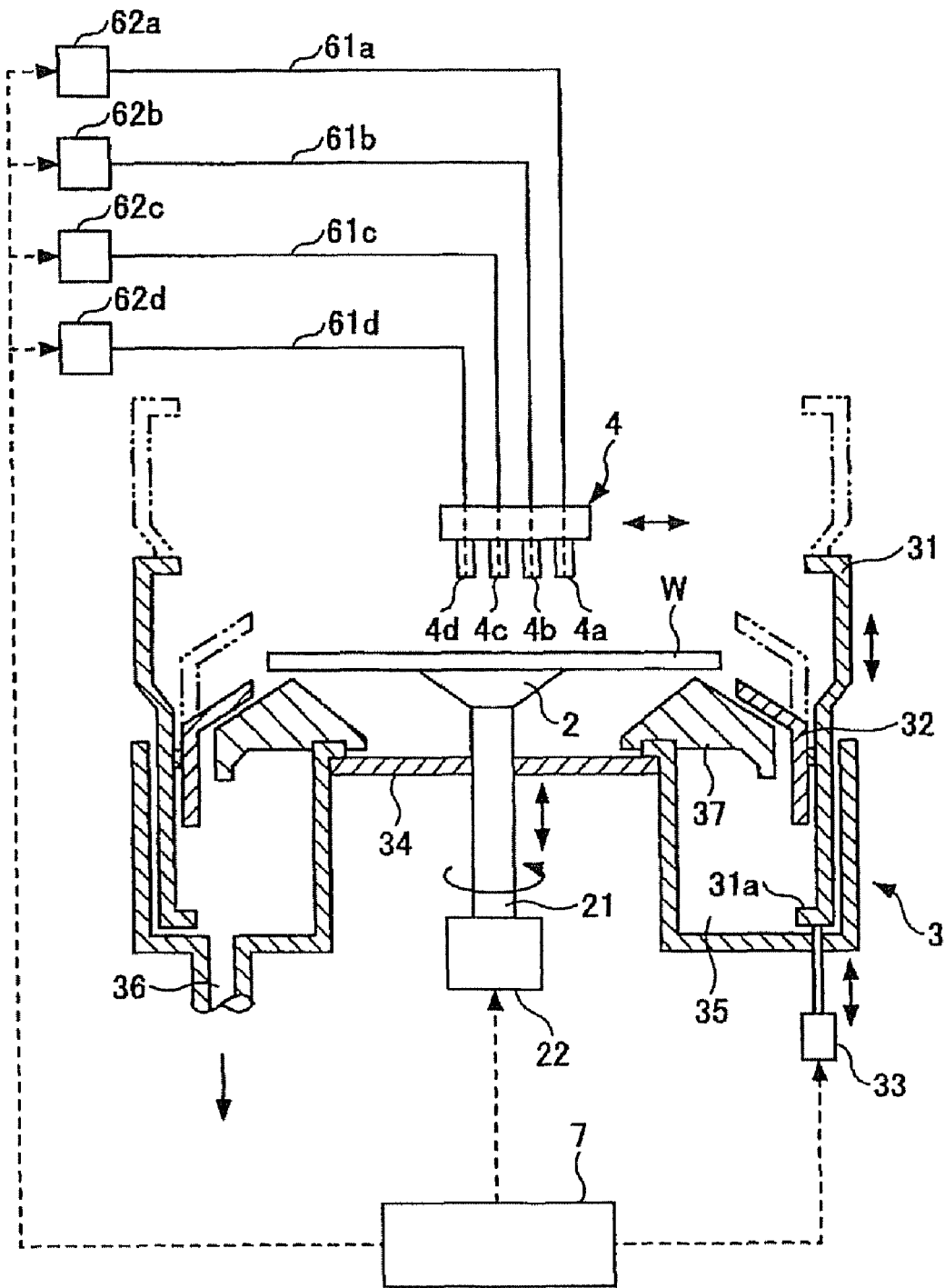
FIG. 3 is a cross-sectional view schematically showing the structure of a developing unit (DEV) of the developing apparatus used for carrying out the developing method in one embodiment of the present invention.
Figure 4:
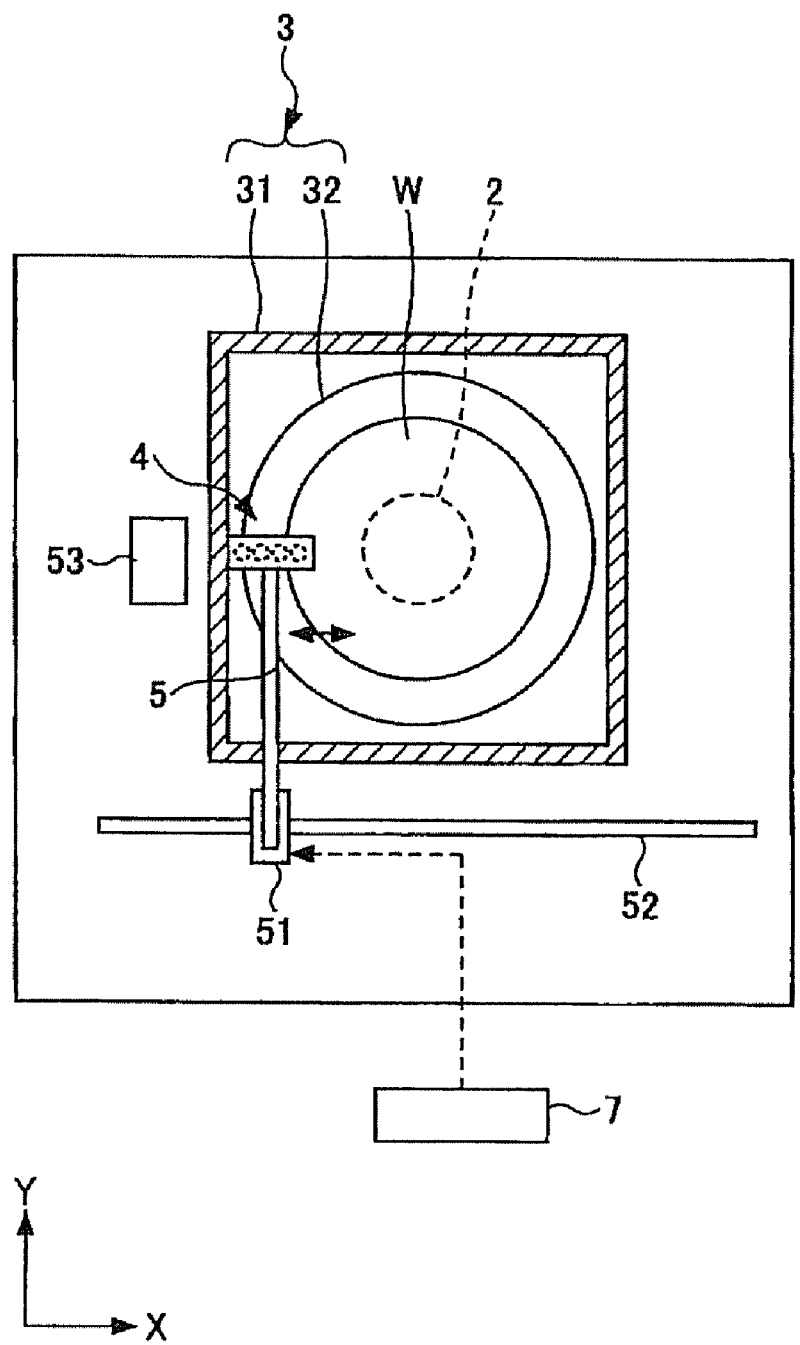
FIG. 4 is a top plan view schematically showing the structure of the developing unit (DEV) of the developing apparatus used for carrying out the developing method in one embodiment of the present invention.

Next, with reference to FIGS. 3 and 4, the developing unit DEV of the developing apparatus used for carrying out the developing method in this embodiment is explained. FIG. 3 is a cross-sectional view schematically showing the structure of the developing unit DEV, and FIG. 4 is a top plan view thereof.

The developing unit DEV includes a spin chuck 2, a cup body 3, a nozzle (an integrated nozzle unit) 4, and a control device 7.

The spin chuck 2 is a substrate holder that sucks a central portion of a rear surface of a substrate, such as a wafer W, so as to horizontally hold the same. As shown in FIG. 3, the spin chuck 2 is connected to a drive mechanism 22, which serves as a rotary drive mechanism, through a rotation shaft 21. The spin chuck 2 is configured to be capable of rotating and moving vertically, while holding a wafer W. In the example shown in FIG. 3, a center of the wafer W is positioned on a rotation axis of the spin chuck 2. However, in this embodiment, it is not necessary that the center of the wafer W is positioned exactly on the rotation axis, as long as the center of the wafer W is positioned within a circular area having a radius of 1 to 15 mm and having its center on the rotation axis, for example.

The cup body 3 has an upper opening, and is disposed so as to surround the wafer W on the spin chuck 2. The cup body 3 is composed of an outer cup 31 having a rectangular upper part and a cylindrical lower part, and a tubular inner cup 32 having an upper part that is inclined inward. The outer cup 31 can be moved vertically by an elevation part 33 connected to a lower end of the outer cup 31. In addition, the inner cup 32 can be moved vertically by a stepped part 31a that pushes up the inner cup 32, the stepped part 31 being formed on a lower inner peripheral portion of the outer cup 31.

As shown in FIG. 3, a circular plate 34 is disposed below the spin chuck 2. A liquid receiving part 35 having a recessed cross-section is provided outside the circular plate 34 along a whole circumference thereof.

A drain port 36 is formed in a bottom surface of the liquid receiving part 35. Thus, a developing liquid and a rinse liquid, which have been spilt from or spun off from the wafer W and are stored in the liquid receiving part 35, are discharged outside the system through the drain port 36.

In addition, a ring member 37 having a chevron-like cross-section is disposed outside the circular plate 34. Although not shown, there are provided a plurality of, e.g., three elevation pins as substrate support pins passing through the circular plate 34. By means of a cooperation of the elevation pins and a substrate transfer means, not shown, the wafer W can be transferred to the spin chuck 2.

The nozzle 4 includes a pre-wet nozzle 4a, a developer nozzle 4b, a rinse nozzle 4c, and a gas nozzle 4d, which are aligned in a row. The nozzle 4 is movable in the vertical direction and in the horizontal direction, with the pre-set nozzle 4a, the developer nozzle 4b, the rinse nozzle 4c, and the gas nozzle 4d being opposed to the surface of the wafer W held by the spin chuck 2.

As shown in FIG. 3, one end of a supply channel, e.g., a pre-wet duct 61a is connected to the pre-wet nozzle 4a, and the other end of the pre-wet duct 61a is connected to a supply source 62a of a pre-wet liquid. The pre-wet duct 61a is provided with a liquid feeding means (not shown) such as a bellows pump whose discharging flow rate can be regulated by varying a discharging stroke.

As shown in FIG. 3, one end of a supply channel, e.g., a developer duct 61b is connected to the developer nozzle 4b, and the other end of the developer duct 61b is connected to a supply source 62b of a developing liquid. The developer nozzle 4b can supply a developing liquid at a predetermined flow rate (e.g., 600 ml/min). In addition, the supply source 62b of a developing liquid has a temperature regulating mechanism, not shown, so that a developing liquid, which is regulated at a predetermined temperature (e.g., 23° C.), can be supplied to the nozzle. Namely, since a developing liquid whose temperature is suited for a process is supplied at any time, a uniform developing process can be performed to a wafer group coated with a resist of the same kind.

As shown in FIG. 3, one end of a supply channel, e.g., a DIW duct 61c is connected to the DIW nozzle 4c, and the other end of the DIW duct 61c is connected to a supply source 62c of deionized water. The DIW nozzle 4c is provided with a flow-rate regulating valve, not shown, so that a discharging flow rate can be regulated. The DIW nozzle 4c is a nozzle for discharging, e.g., deionized water serving as a rinse liquid for rinsing the developing liquid on the wafer surface. Thus, another rinse liquid that is not deionized water can be used as a liquid to be discharged from the DIW nozzle 4c, as long as the rinse liquid can rinse the developing liquid on the wafer surface.

As shown in FIG. 3, one end of a supply channel, e.g., a gas duct 61d is connected to the gas nozzle 4d, and the other end of the gas duct 61d is connected to a supply source 62d of a gas. The gas nozzle is a nozzle for jetting $N_2$ gas onto the wafer surface, to thereby blow off the rinse liquid such as deionized water on the wafer surface. Thus, another inert gas that is not $N_2$ gas can be used as a gas to be jetted from the gas nozzle, as long as the gas can blow off the rinse liquid such as deionized water on the wafer surface.

A surfactant nozzle for supplying a surfactant onto the wafer surface may be further integrated with the nozzle 4, as well as the pre-wet nozzle 4a, the developer nozzle 4b, the DIW nozzle 4c, and the gas nozzle 4d.

As shown in FIG. 4, the nozzle 4 is supported on one end of a nozzle arm 5 which is a support member, and the other end of the nozzle arm 5 is connected to a movable base body 51 having an elevation mechanism, not shown. The movable base body 51 is configured to be movable in a lateral direction along a guide member 52, which extends in X direction on a bottom surface of an exterior body of the developing unit, for example. Owing to the movable mechanism, the nozzle 4 can be moved along a straight line between a position outside a wafer W and a central position thereof. In addition, a waiting part 53 for the nozzle 4 is disposed outside the cup body 3. In the nozzle waiting part 53, cleaning of the tip portions of the nozzle 4 is performed.

The control device 7 comprises a computer, and controls operations of the pre-wet supply source 62a, the developer supply source 62b, the DIW supply source 62c, the gas supply source 62d, the drive mechanism 22, the elevation part 33, and the movable base body 51. Specifically, in this embodiment, the control device 7 performs a control such that, when the nozzle 4 is moved from the central portion of the wafer W toward the peripheral portion of the wafer W, the pre-wet nozzle 4a supplies a pre-wet liquid, that the developer nozzle 4b supplies a developing liquid, that the DIW nozzle 4c supplies deionized water, and that the gas nozzle 4d jets a gas.

A not-shown storage part of the control device 7 stores a developing process program which includes: one or more process recipes comprising a software which defines moving operations and discharging operations of the pre-wet nozzle 4a, the developer nozzle 4b, the DIW nozzle 4c, and the gas nozzle 4d, and a rotational operation of a wafer W; and a command part incorporating commands for implementing the respective operations based on one of the process recipes. The control device 7 reads out the developing process program stored in the storage part, and controls the respective members such that the developing process is performed. The developing process program is stored in the storage part of the control device, with the process program being stored in a storage medium such as a hard disc, a compact disc, a magnetoptical disc and a memory card.

Figure 5:
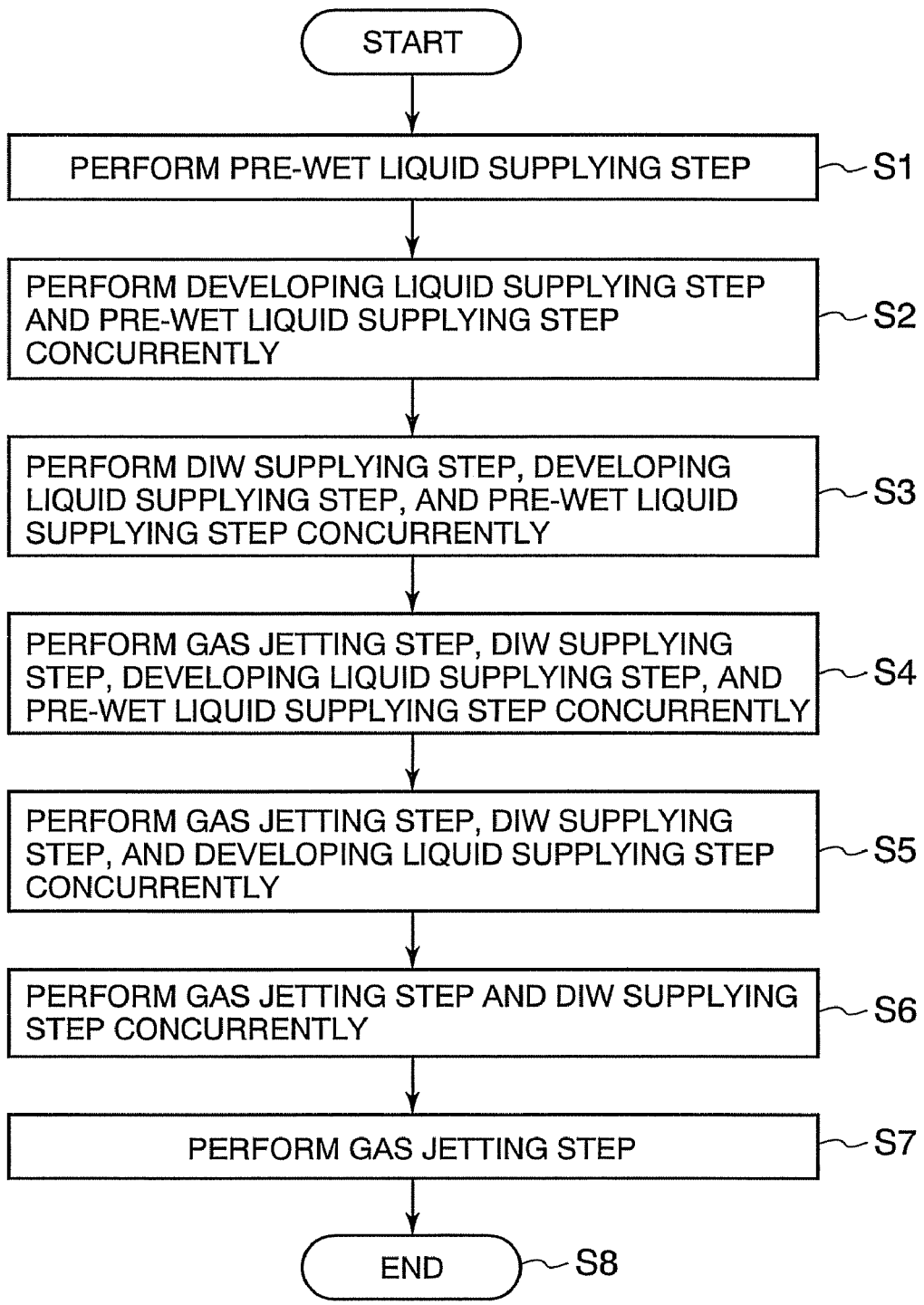
FIG. 5 is a flowchart explaining the process steps of the developing method in one embodiment of the present invention.
Figure 6A:
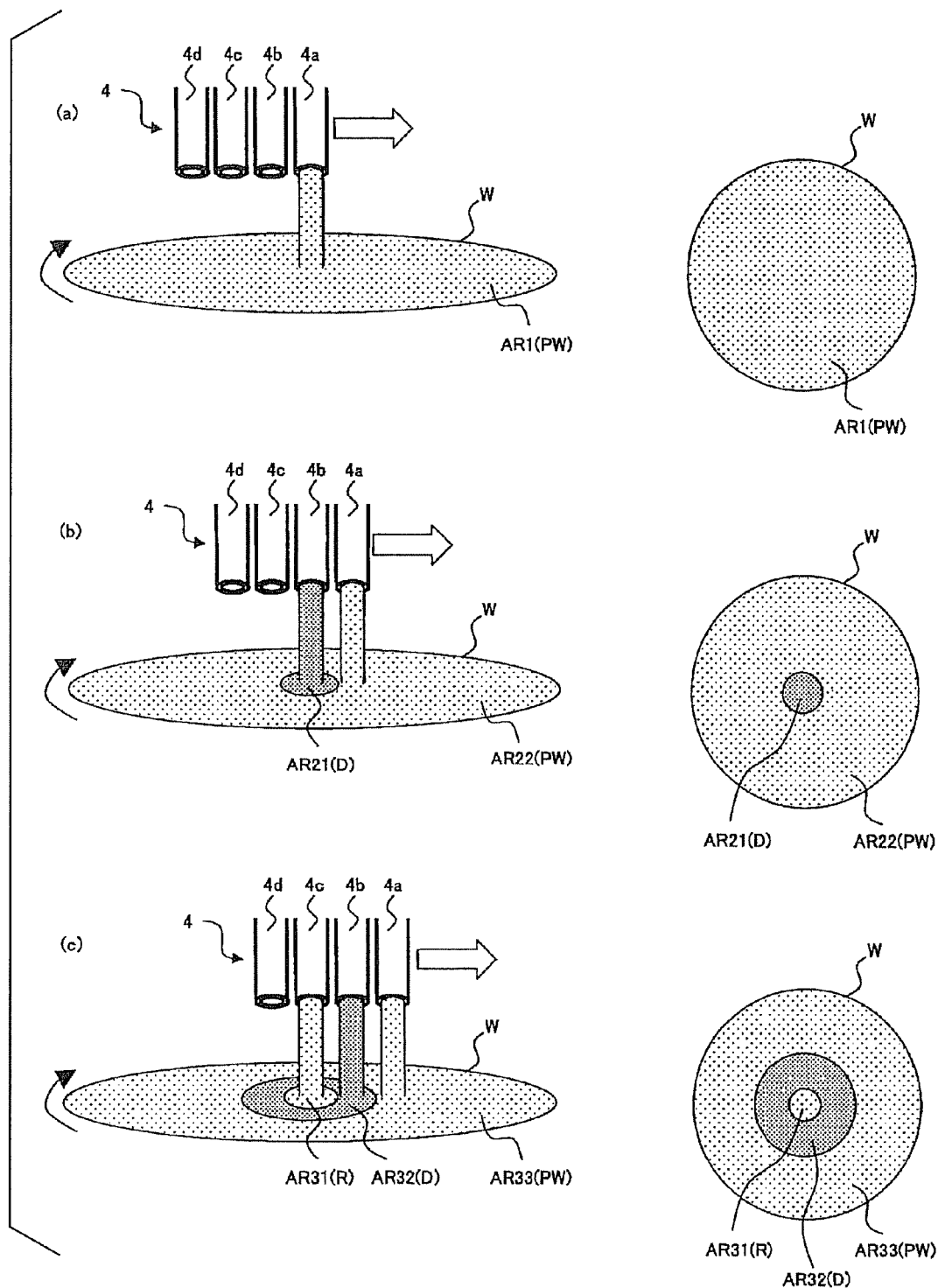
FIG. 6A show a perspective view and a top plan view schematically showing how a pre-wet liquid, a developing liquid, deionized water, and/or a gas are supplied/discharged onto a wafer, in the developing method in one embodiment of the present invention (Section 1).
Figure 6B:
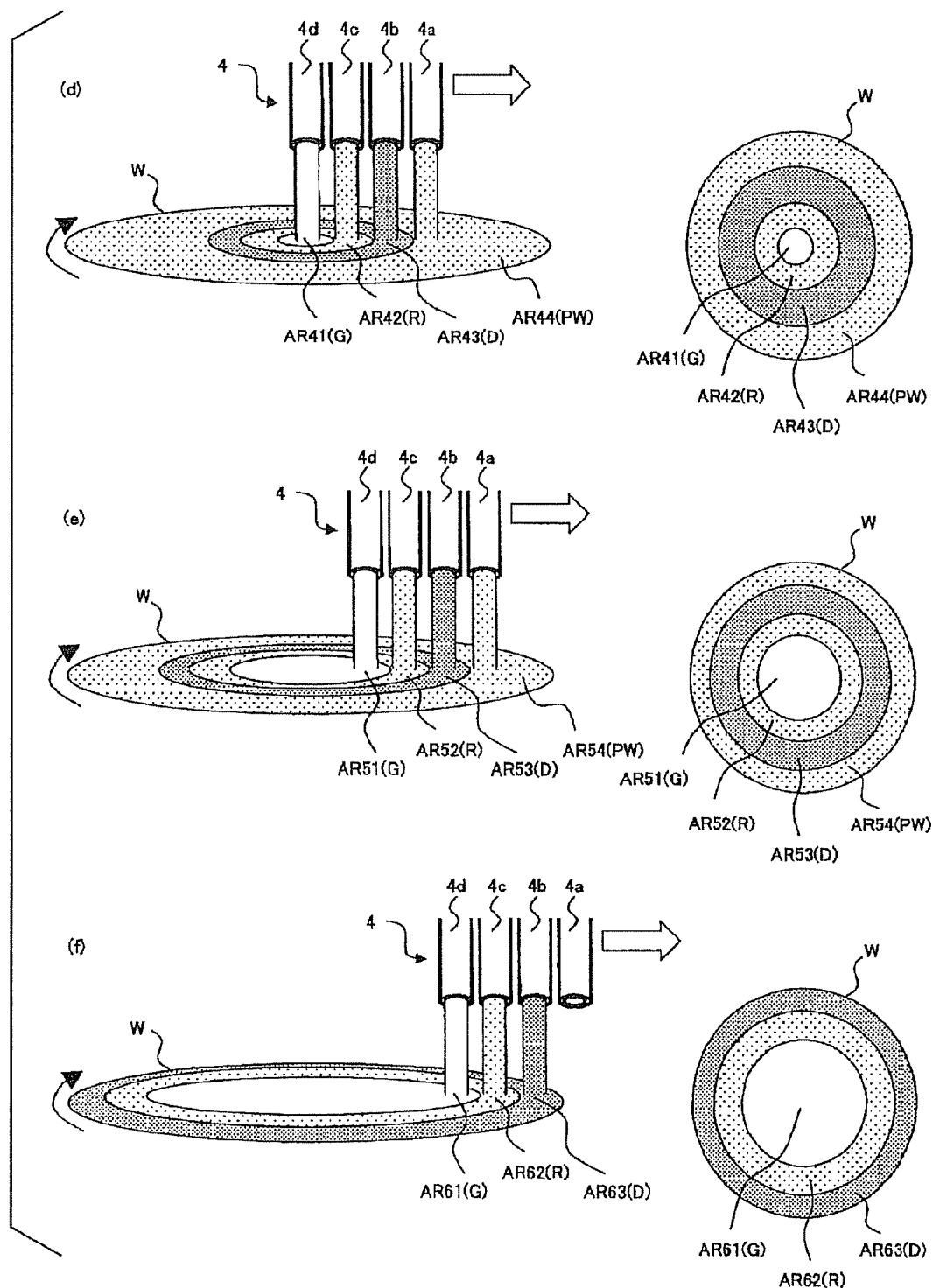
FIG. 6B show a perspective view and a top plan view schematically showing how a pre-wet liquid, a developing liquid, deionized water, and/or a gas are supplied/discharged onto a wafer, in the developing method in one embodiment of the present invention (Section 2).

Next, the developing method in this embodiment, in which developing steps of a wafer W are performed by the developing unit DEV, for example, will be described with reference to FIGS. 5 to 7. FIG. 5 is a flowchart explaining the process steps of the developing method in this embodiment. FIGS. 6A(a) to 6C(i) show perspective views and top plan views schematically showing how a pre-wet liquid, a developing liquid, deionized water, and/or a gas are supplied/jetted onto a wafer. In each of FIGS. 6A(a) to 6C(i), the perspective view is shown on the left side, and the top plan is shown on the right side. FIGS. 6A(a) to 6A(c) respectively correspond to steps S1 to S3 in FIG. 5. FIGS. 6B(d) and 6B(e) correspond to a step S4 in FIG. 5. FIG. 6B(f) to FIG. 6C(i) respectively correspond to steps S5 to S8. FIG. 7 show a front view and a side view, for explaining the developing method in this embodiment, schematically showing, together with a part of the substrate, the structure of the pre-wet nozzle, the developer nozzle, the DIW nozzle and the gas nozzle which are integrated. In FIG. 7, the front view is shown on the left side, and the side view is shown on the right side.

In the developing steps for carrying out the developing method in this embodiment, a process recipe is determined depending on various conditions such as the type of the resist and the type of the resist pattern (line pattern, hole pattern). In the following description, it is assumed that the developing process is performed under control of the control device 7 based on a predetermined process recipe, and that the process recipe includes steps S1 to S8.

Herein, ArF resist AIM5796 (trade name, JSR corporation) is used as a resist, for example. NMD3 (trade name, Tokyo Ohka Kogyo Co., Ltd) is used as a developing liquid, for example. The temperature of the developing liquid is set at, e.g., 23° C. The supply rate of the developing liquid from the developer nozzle 4b is set at, e.g., 600 ml/min. The supply rates of deionized water from pre-wet nozzle 4a and the DIW nozzle 4c are set at, e.g., 1000 ml/min. The jetting rate of a gas from the gas nozzle 4d is set at, e.g., 5000 ml/min.

Inside diameters of the pre-wet nozzle 4a, the developer nozzle 4b, and the DIW nozzle 4c may be 2 to 10 mm, more preferably 5 mm, for example.

As shown in FIG. 5, the developing method in this embodiment includes the steps S1 to S8. In the step S1, a per-wet liquid supplying step is performed. In the step S2, the pre-wet liquid supplying step and a developing liquid supplying step are performed concurrently, while the developer nozzle is maintained nearer to a center of a substrate than the pre-wet nozzle. In the step S3, the pre-wet liquid supplying step, the developing liquid supplying step, and a DIW supplying step are performed concurrently, while the developer nozzle is maintained nearer to the center of the substrate than the pre-wet nozzle, and the DIW nozzle is maintained nearer to the center of the substrate than the developer nozzle. In the step S4, the pre-wet liquid supplying step, the developer liquid supplying step, the DIW supplying step, and a gas jetting step are performed concurrently, while the developer nozzle is maintained nearer to the center of the substrate than the pre-wet nozzle, the DIW nozzle is maintained nearer to the center of the substrate than the developer nozzle, and the gas nozzle is maintained nearer to the center of the substrate than the DIW nozzle. In the step S5, the developing liquid supplying step, the DIW supplying step, and the gas jetting step are performed concurrently, while the DIW nozzle is maintained nearer to the center of the substrate than the developer nozzle, and the gas nozzle is maintained nearer to the center of the substrate than the DIW nozzle. In the step S6, the DIW supplying step and the gas jetting step are performed concurrently, while the gas nozzle is maintained nearer to the center of the substrate than the DIW nozzle. In the step S7, the gas jetting step is performed. In the step S8, all the processes are finished.

Before starting the step S1, a wafer W, which has a surface coated with a resist having been exposed, is loaded by the substrate transfer means, not shown. At this time, the outer cup 31 and the inner cup 32 are located on the lowered positions, and the nozzle 4 is disposed above the nozzle waiting part 53. Then, by means of a cooperation of the substrate transfer means and the elevation pins, not shown, the wafer W can be transferred to the spin chuck 2.

Then, the outer cup 31 and the inner cup 32 are moved to the elevated positions. In addition, the nozzle 4 comprising the pre-wet nozzle 4a, the developer nozzle 4b, the rinse nozzle 4c, and the gas nozzle 4d, is placed in a position, from which the supply of the developing liquid is started, e.g., a position (i.e., starting position) which is slightly above the surface of the wafer W, such that the pre-wet nozzle 4a is located in a position above a substantial center of the substrate.

Further, before starting the step S1, the wafer W is rotated about a vertical axis. The rotation speed of the wafer W may be within a range between 1000 and 2000 rpm. For example, the wafer W may be rotated at 1500 rpm.

Firstly, the step S1 is performed. As shown in FIG. 6A(a), in the step S1, the pre-wet liquid supplying step is performed in the following manner. There is started supply of a small amount of pre-wet liquid PW such as deionized water from the pre-wet nozzle 4a onto the central portion of the wafer W, while the pre-wet nozzle 4a is located above the center of the wafer W. Then, while the pre-wet nozzle 4a is moved from the central portion of the wafer W toward a peripheral portion of the wafer W, the pre-wet liquid PW is supplied from the discharge port of the pre-wet nozzle 4a onto the surface of the substrate. At this time, the developer nozzle 4b, the DIW nozzle 4c, and the gas nozzle 4d are moved together with the pre-wet nozzle 4a.

As shown in FIG. 6A(a), the pre-wet liquid supplying step is performed, so that the pre-wet liquid PW is supplied from the position above the approximate center of the rotating wafer W onto the wafer W. Thus, the pre-wet liquid PW spreads outward by the centrifugal force, and an area AR1 over substantially the whole surface of the wafer W is thus covered with the pre-wet liquid PW. Namely, the whole surface of the wafer W is subjected to a pre-wet process, i.e., a process for improving wettability of the wafer surface, whereby the developing liquid to be subsequently supplied will rapidly spread on the surface of the wafer W.

As shown in FIG. 6A(a), the pre-wet nozzle 4a, the developer nozzle 4b, the DIW nozzle 4c, and the gas nozzle 4d are arranged in this order in a direction opposite to the moving direction of the pre-wet nozzle 4a. A moving velocity of the nozzle 4 may be set at a range between 5 and 20 mm/sec, preferably at 10 mm/sec.

Thereafter, the pre-wet nozzle 4a, the developer nozzle 4b, the DIW nozzle 4c, and the gas nozzle 4d are moved as an integrated unit. When the developer nozzle 4b reaches a position above the approximate center of the wafer W, the step S2 is performed by starting supply of a developing liquid D from the developer nozzle 4b. As shown in FIG. 6A(b), in the step S2, the nozzle 4 comprising the pre-wet nozzle 4a, the developer nozzle 4b, the rinse nozzle 4c, and the gas nozzle 4d is moved such that the pre-wet nozzle 4a and the developer nozzle 4b are moved above the wafer W from the central portion of the wafer W toward the peripheral portion thereof, while the pre-wet liquid PW is supplied from the pre-wet nozzle 4a and the developing liquid D is supplied from the developer nozzle 4b. In other words, the pre-wet liquid supplying step and the developing liquid supplying step are performed concurrently, while the developer nozzle 4b is maintained nearer to the center of the substrate than the pre-wet nozzle 4a.

As shown in FIG. 6A(b), in a central area AR 21 of the wafer W: the developing liquid supplying step is performed; the developing liquid D is supplied from the developer nozzle 4b from the position above the approximate center of the rotating wafer W onto the wafer W; and thus the surface of the wafer W is covered with the developing liquid D. In a peripheral area AR 22 outside the central area AR21 of the wafer W: the pre-wet liquid supplying step is performed; the pre-wet liquid PW is supplied onto the wafer W from the pre-wet nozzle 4a which is positioned above the rotating wafer W and nearer to the periphery of the wafer W than the developer nozzle 4b; and the supplied pre-wet liquid PW spreads outward by the centrifugal force so that the surface of the wafer W is covered with the pre-wet liquid PW.

In a boundary between the central area AR21 of the wafer W and the peripheral area AR22 outside the area AR21, there is a possibility that the pre-wet liquid PW and the developing liquid D are mixed with each other, depending on a relation between the moving velocity of the nozzle 4 and the rotation speed of the wafer W. In such a case, a clear boundary line, which is shown in FIG. 6A(b), is not present. However, even if such a clear boundary line between the area AR21 and the area AR22 is not present, the developing process normally proceeds in a portion in the area AR21 at a certain distance away from the boundary between the areas AR21 and AR22 because the concentration of the developing liquid in such a portion in the area AR21 is substantially equal to the concentration of the developing liquid as supplied.

Thereafter, the pre-wet nozzle 4a, the developer nozzle 4b, the DIW nozzle 4c, and the gas nozzle 4d are moved as an integrated unit. When the DIW nozzle 4c reaches a position above the approximate center of the wafer W, the step S3 is performed by starting supply of deionized water R from the DIW nozzle 4c. As shown in FIG. 6A(c), in the step S3, the nozzle 4 comprising the pre-wet nozzle 4a, the developer nozzle 4b, the rinse nozzle 4c, and the gas nozzle 4d is moved such that the pre-wet nozzle 4a, the developer nozzle 4b, and the DIW nozzle 4c are moved above the wafer W from the central portion of the wafer W toward the peripheral portion thereof, while the pre-wet liquid PW is supplied from the pre-wet nozzle 4a, the developing liquid D is supplied from the developer nozzle 4b, and the deionized water R is supplied from the DIW nozzle 4c. In other words, the pre-wet supplying step, the developing liquid supplying step, and the DIW supplying step are performed concurrently, while the DIW nozzle 4c is maintained nearer to the center of the wafer W than the developer nozzle 4b.

As shown in FIG. 6A(c), in a central area AR 31 of the wafer W: the DIW supplying step is performed; the deionized water R is supplied from the DIW nozzle 4c from the position above the substantial center of the rotating wafer W onto the wafer W, whereby the developing liquid D on the surface of the wafer W is rinsed by the deionized water. In a peripheral area AR32 adjacently outside the central area AR31 of the wafer W: the developing liquid supplying step is performed; the developing liquid is supplied onto the wafer W from the developer nozzle 4b which is positioned above the rotating wafer W and nearer to the periphery of the wafer W than the DIW nozzle 4c, so that the surface of the wafer W is covered with the developing liquid D. In addition, in a peripheral area AR33 outside the area AR32 of the wafer W: the pre-wet liquid supplying step is performed; the pre-wet liquid PW is supplied onto the wafer W from the pre-wet nozzle 4a which is positioned above the rotating wafer W and nearer to the periphery of the wafer W than the developer nozzle 4b; the supplied pre-wet liquid PW spreads outward by the centrifugal force, whereby the surface of the wafer W is covered with the pre-wet liquid PW.

In a boundary between the central area AR31 of the wafer W and the peripheral area AR32 outside the area AR31, there is a possibility that the deionized water R and the developing liquid D are mixed with each other, depending on a relation between the moving velocity of the nozzle 4 and the rotation speed of the wafer W. In such a case, a clear boundary line, which is shown in FIG. 6A(c), is not present. However, even if such a clear boundary line between the area AR31 and the area AR32 is not present, the concentration of the developing liquid D in a portion of the area AR32 a certain distance away from the boundary between the areas AR31 and AR32 is substantially equal to the concentration of the developing liquid as supplied. Similarly, the concentration of the developing liquid D in a portion of the area AR32 a certain distance away from the boundary between the areas AR33 and AR32 is substantially equal to the concentration of the developing liquid as supplied. Thus, the developing process normally proceeds in the area AR32 if a certain radial width of the area AR32 is established.

Thereafter, the pre-wet nozzle 4a, the developer nozzle 4b, the DIW nozzle 4c, and the gas nozzle 4d are moved as an integrated unit. When the gas nozzle 4d reaches a position above the substantial center of the wafer W, the step S4 is performed by starting supply of a gas G from the gas nozzle 4d. As shown in FIG. 6B(d), the nozzle 4 comprising the pre-wet nozzle 4a, the developer nozzle 4b, the rinse nozzle 4c, and the gas nozzle 4d is moved such that the pre-wet nozzle 4a, the developer nozzle 4b, and the DIW nozzle 4c are moved above the wafer W from the central portion of the wafer W toward the peripheral portion thereof, while the pre-wet liquid PW is supplied from the pre-wet nozzle 4a, the developing liquid D is supplied from the developer nozzle 4b, the deionized water R is supplied from the DIW nozzle 4c, and the gas G is jetted from the gas nozzle 4d. In other words, the pre-wet liquid supplying step, the developing liquid supplying step, the DIW supplying step, and the gas jetting step are performed concurrently, while the developer nozzle 4b is maintained nearer to the center of the wafer W than the pre-wet nozzle 4a, the DIW nozzle 4c is maintained nearer to the center of the wafer W than the developer nozzle 4b, and the gas nozzle 4d is maintained nearer to the center of the wafer W than the DIW nozzle 4c.

As shown in FIG. 6B(d), in a central area AR41 of the wafer W: the gas jetting step is performed; the gas is jetted from the gas nozzle 4d from the position above the substantial center of the rotating wafer W onto the wafer W, whereby the deionized water on the surface of the wafer W is blown off and dried. In a peripheral area AR42 adjacently outside the central area AR41: the DIW supplying step is performed; the deionized water R is supplied onto the wafer W from the DIW nozzle 4c which is positioned above the rotating wafer W and nearer to the periphery of the wafer W than the gas nozzle 4d, whereby the developing liquid D on the surface of the wafer W is rinsed by the deionized water R. In addition, in an area AR43 adjacently outside the area AR42 of the wafer W: the developing liquid supplying step is performed; the developing liquid D is supplied onto the wafer W from the developer nozzle 4b which is positioned above the rotating wafer W and nearer to the periphery of the wafer W than the DIW nozzle 4c, whereby the surface of the wafer W is covered with the developing liquid D. In addition, in an area AR44 outside the area AR43 of the wafer W: the pre-wet liquid supplying step is performed; the pre-wet liquid PW is supplied onto the wafer W from the pre-wet nozzle 4a which is positioned above the rotating wafer W and nearer to the periphery of the wafer W than the developer nozzle 4b; and the supplied pre-wet liquid PW spreads outward by the centrifugal force, whereby the surface of the wafer W is covered with the pre-wet liquid PW.

Thereafter, as shown in FIG. 6B(e), the nozzle 4 comprising the pre-wet nozzle 4a, the developer nozzle 4b, the rinse nozzle 4c, and the gas nozzle 4d is moved such that the pre-wet nozzle 4a, the developer nozzle 4b, the DIW nozzle 4c, and the gas nozzle 4d are moved above the wafer W from the central portion the wafer W toward the peripheral portion thereof, while the pre-wet liquid PW, the developing liquid D, the deionized water R, and/or the gas G are supplied or jetted from the respective pre-wet nozzle 4a, the developer nozzle 4b, the DIW nozzle 4c, and/or the gas nozzle 4d. As shown in FIG. 6B(e), the gas jetting step is performed in a central area AR51 of the wafer W, the DIR supplying step is performed in a peripheral area AR52 adjacently outside the area AR51, the developing liquid supplying step is performed in a peripheral area AR53 adjacently outside the area AR52, and the pre-wet liquid supplying step is performed in a peripheral area AR54 outside the area AR53. At this time, as shown in FIG. 6B(e), in an area AR51 including an outer area onto which the gas G to the wafer W is jetted from the gas nozzle 4d and an inner area inside the outer area: in the outer area, the gas jetting step is performed so that the gas G is jetted from the gas nozzle 4d above the rotating wafer W onto the wafer W, whereby the deionized water R is blown off and dried; in the inner area nearer to the center of the wafer W than the area to which the gas G is jetted, the deionized water R has been already dried.

Thereafter, the pre-wet nozzle 4a, the developer nozzle 4b, the DIW nozzle 4c, and the gas nozzle 4d are moved as an integrated unit. When the pre-wet nozzle 4a reaches the peripheral portion of the wafer W, the step S5 is performed by stopping the supply of the pre-wet liquid PW from the pre-wet nozzle 4a. As show in FIG. 6B(f), in the step S5, the nozzle 4 including the pre-wet nozzle 4a, the developer nozzle 4b, the rinse nozzle 4c, and the gas nozzle 4d is moved such that the developer nozzle 4b, the DIW nozzle 4c, and the gas nozzle 4d are moved above the wafer W from the central portion of the wafer W toward the peripheral portion thereof, while the developing liquid is supplied from the developer nozzle 4b, the deionized water R is supplied from the DIW nozzle 4c, and the gas G is jetted from the gas nozzle 4*d*. The developing liquid supplying step, the DIW supplying step, and the gas jetting step are performed concurrently, while the DIW nozzle 4*c* is maintained nearer to the center of the wafer W than the developer nozzle 4*b*, and the gas nozzle 4*d* is maintained nearer to the center of the wafer W than the DIW nozzle 4*c*.

As shown in FIG. 6B(f), in an area AR61 of the wafer W including an outer area onto which the gas G to the wafer W is jetted from the gas nozzle 4*d* and a inner area inside the outer area: in the outer area, the gas jetting step is performed within the area of the wafer W onto which the gas G to the wafer W is jetted from the gas nozzle 4*d*, so that the gas G is jetted from above the rotating wafer W by the gas nozzle 4*d* onto the wafer W, whereby the deionized water R on the surface of the wafer W is blown off and dried; and in the inner area of the area AR61 inside the outer area onto which the gas G to the wafer W is jetted, the deionized water R has been already dried. In a peripheral area AR62 adjacently outside the central area AR61 of the wafer W: the deionized water supplying step is performed, so that the deionized water R is supplied onto the wafer W from the DIW nozzle 4*c* which is positioned above the rotating wafer W and nearer to the periphery of the wafer W than the gas nozzle 4*d*; and thus the developing liquid D on the surface of the wafer W is rinsed by the deionized water R. In addition, in a peripheral area AR63 outside the area AR62 of the wafer W: the developing liquid supplying step is performed, so that the developing liquid D is supplied onto the wafer W from the developer nozzle 4*b* which is positioned above the rotating wafer W and nearer to the periphery of the wafer W than the DIW nozzle 4*c*; and thus the surface of the wafer W is covered with the developing liquid D.

Thereafter, the pre-wet nozzle 4*a*, the developer nozzle 4*b*, the DIW nozzle 4*c*, and the gas nozzle 4*d* are moved as an integrated unit. When the developer nozzle 4*b* reaches the peripheral portion of the wafer W, the step S6 is performed by stopping the supply of the developing liquid from the developer nozzle 4*b*. As shown in FIG. 6C(g), in the step S6, the nozzle 4 comprising the pre-wet nozzle 4*a*, the developer nozzle 4*b*, the rinse nozzle 4*c*, and the gas nozzle 4*d* is moved such that the DIW nozzle 4*c* and the gas nozzle 4*d* are moved above the wafer W from the central portion of the wafer W toward the peripheral portion thereof, while the deionized water R is supplied from the DIW nozzle 4*c* and the gas G is jetted from the gas nozzle 4*d*. The DIW supplying step and the gas jetting step are performed concurrently, while the gas nozzle 4*d* is maintained nearer to the center of the substrate than the DIW nozzle 4*c*.

Figure 6C:
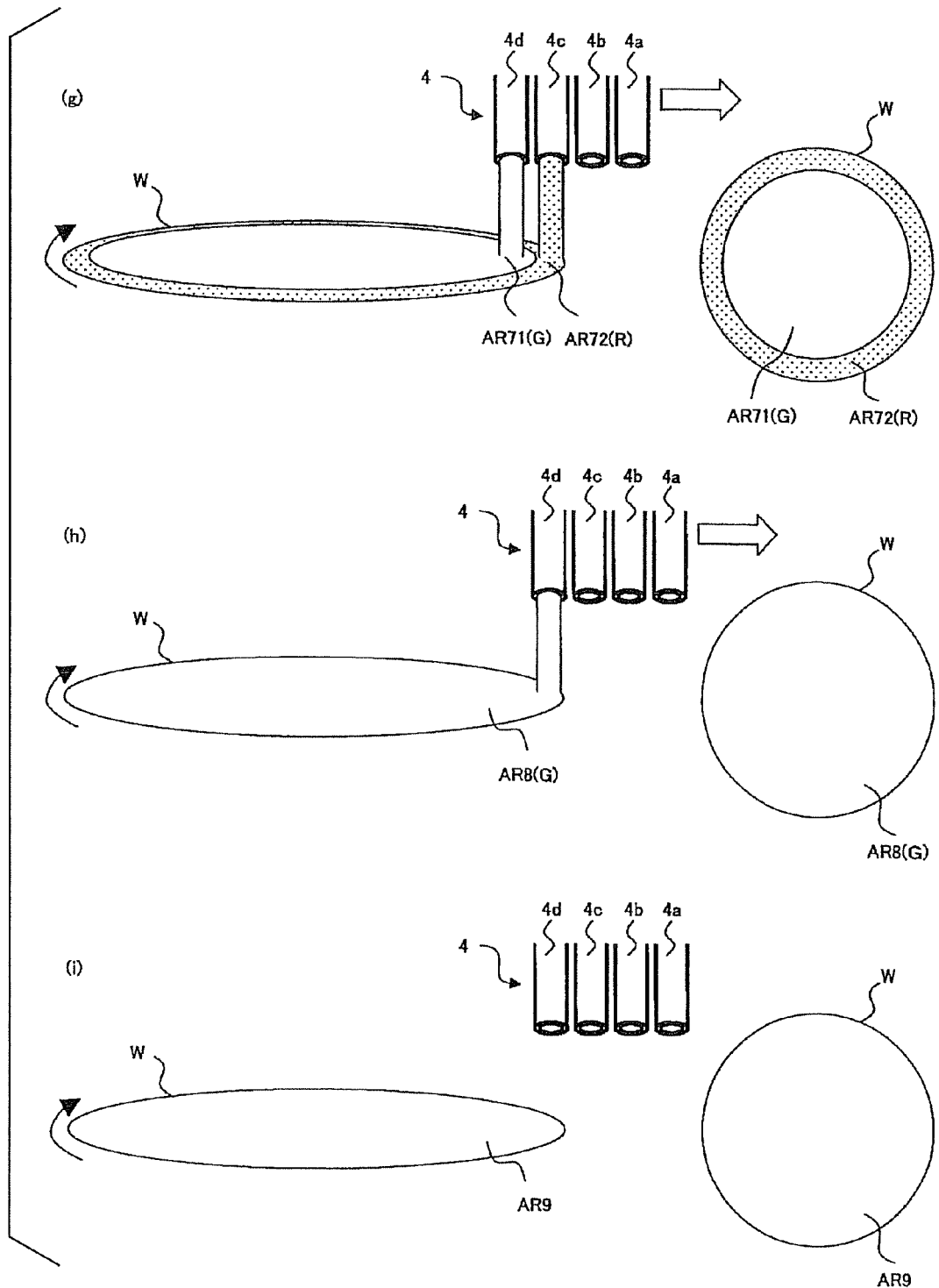
FIG. 6C show a perspective view and a top plan view schematically showing how a pre-wet liquid, a developing liquid, deionized water, and/or a gas are supplied/discharged onto a wafer, in the developing method in one embodiment of the present invention (Section 3).
Figure 7:
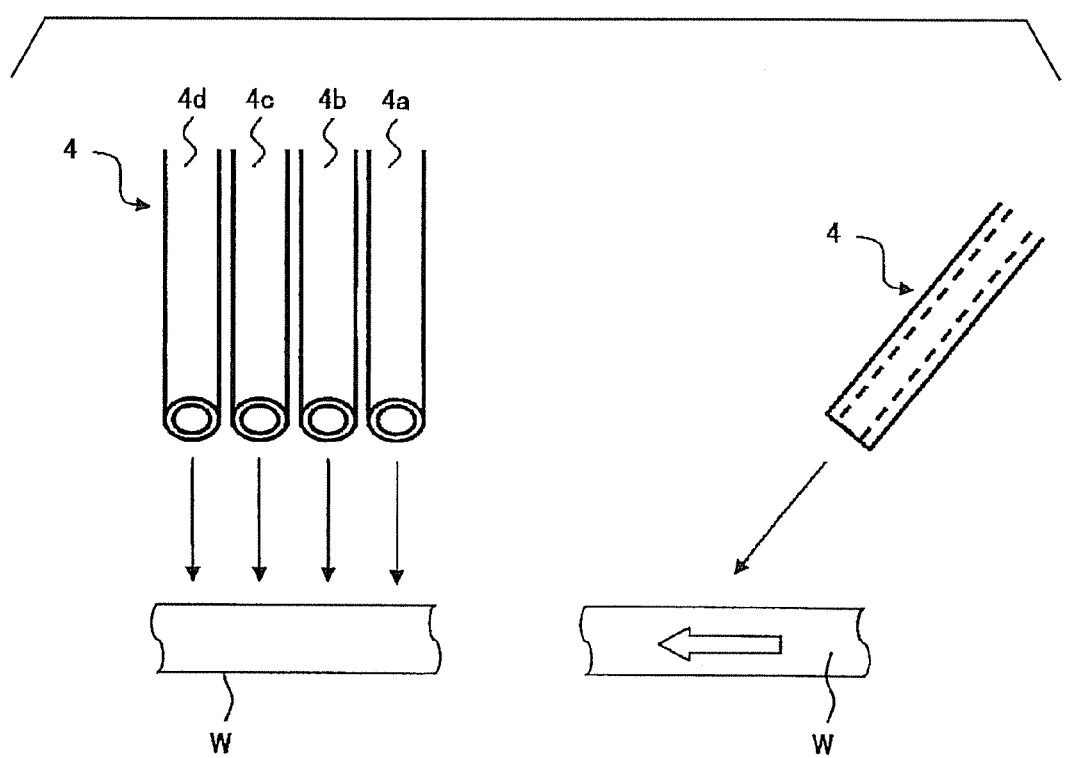
FIG. 7 show a front view and a side view schematically showing, together with a part of the substrate, the structure of a integrated nozzle unit including a pre-wet nozzle, a developer nozzle, a DIW nozzle and a gas nozzle, for explaining the developing method in one embodiment of the present invention.

As shown in FIG. 6C(g), in an area AR71 of the wafer W including an outer area onto which the gas G to the wafer W is jetted from the gas nozzle 4*d* and a inner area inside the outer area: in the outer area, the gas jetting step is performed within the area of the wafer W onto which the gas G to the wafer W is jetted from the gas nozzle 4*d*, so that the gas G is jetted from above the rotating wafer W by the gas nozzle 4*d* onto the wafer W, whereby the deionized water R on the surface of the wafer W is blown off and dried; and in the inner area of the area AR71 inside the outer area onto which the gas G to the wafer W is jetted, the deionized water R has been already dried. In a peripheral area AR72 adjacently outside the central area AR71 of the wafer W: the DIW supplying step is performed, so that the deionized water R is supplied onto the wafer W from the DIW nozzle 4*c* which is positioned above the rotating wafer W and nearer to the periphery of the wafer W than the gas nozzle 4*d*; and thus the developing liquid D on the surface of the wafer W is rinsed by the deionized water R.

Thereafter, the pre-wet nozzle 4*a*, the developer nozzle 4*b*, the DIW nozzle 4*c*, and the gas nozzle 4*d* are moved as an integrated unit. When the DIW nozzle 4*c* reaches the peripheral portion of the wafer W, the step S7 is performed by stopping the supply of the deionized water from the DIW nozzle 4*c*. As shown in FIG. 6C(h), in the step S7, the nozzle 4 comprising the pre-wet nozzle 4*a*, the developer nozzle 4*b*, the rinse nozzle 4*c*, and the gas nozzle 4*d* is moved such that the gas nozzle 4*d* is moved above the wafer W from the central portion of the wafer W toward the peripheral portion thereof, while the gas G is jetted from the gas nozzle 4*d*.

As shown in FIG. 6C(h), in an area AR8 over the whole surface of the wafer W: the gas jetting step is performed within an outer area of the area AR8 onto which the gas G to the wafer W is jetted from the gas nozzle 4*d*, so that the gas G is jetted from the gas nozzle 4*d* above the rotating wafer W onto the wafer W, and thus the deionized water R on the surface of the wafer W is blown off and dried; while in an inner area of the area AR8 inside the outer area onto which the gas G to the wafer W is jetted, the deionized water R has been already dried.

Thereafter, as shown in FIG. 6C(i), in the step S8, the pre-wet nozzle 4*a*, the developer nozzle 4*b*, the DIW nozzle 4*c*, and the gas nozzle 4*d* are moved as an integrated unit. When the gas nozzle 4*d* reaches the peripheral portion of the wafer W, the jetting of the gas from the gas nozzle 4*d* is stopped. As shown in FIG. 6C(i), in an area AR9 over the whole surface of the wafer W, the gas jetting step has been finished and the deionized water R has been already dried.

The respective nozzles 4*a* to 4*d* included in the nozzle 4 are moved as an integrated unit. Herein, it is sufficient that the pre-wet nozzle 4*a*, the developer nozzle 4*b*, the DIW nozzle 4*c*, and the gas nozzle 4*d* are arranged above the wafer W in this order from the central portion of the wafer W toward the peripheral portion thereof. Thus, the pre-wet nozzle 4*a*, the developer nozzle 4*b*, the DIW nozzle 4*c*, and the gas nozzle 4*d* may be independently moved.

In order to equalize the amounts of the developing liquid D supplied onto given positions between the central portion of the wafer W and the peripheral portion thereof, velocities at which the respective pre-wet nozzle 4*a*, the developer nozzle 4*b*, the DIW nozzle 4*c*, and the gas nozzle 4*d* are moved may be adjusted such that the moving velocities decrease as the respective nozzles move from the central portion of the wafer W toward the peripheral portion thereof. In a case where the wafer W is rotated at a constant rotation speed and the developing liquid D supplied from the developer nozzle 4*b* falling onto the wafer W has a constant radial width, an area of the wafer W supplied with the developing liquid D per unit time is smaller at central portions of the wafer W while an area of the wafer W supplied with the developing liquid D per unit time is larger at peripheral portions of the wafer W. Thus, by decreasing the moving velocities at which the respective nozzles 4*a* to 4*d* move as the nozzles approach the periphery of the wafer W, the supply amount of the developing liquid D per unit area can be equalized between the central portion of the wafer W and the peripheral portion thereof.

Further, in order to equalize the supply amount of the developing liquid D per unit area between the central portion of the wafer W and the peripheral portion thereof, the rotation speed of the wafer W may be adjusted, e.g., increased or decreased, as the respective nozzles moves above the wafer W from the central portion of the wafer W to the peripheral portion thereof.

Furthermore, the temperature of the developing liquid D may be higher than the normal temperature. For example, the temperature of the developing liquid D may be as high as 50° C.

As shown in the side view in FIG. 7, the vector indicating the direction (see the black arrow) in which the developing liquid D is discharged from the discharge port of the developer nozzle 4b of the nozzle 4 has a component whose direction is the same as the rotation direction (see the white arrow) of the wafer W. That is to say, on the assumption of a cylindrical coordinate system (r, φ, h), not shown, in which the center of the wafer surface provides the original point, the vector indicating the discharging direction of the developing liquid has the component φ whose direction is the same as a rotation direction of the wafer W. In addition, since the pre-wet nozzle 4a, the developer nozzle 4b, the DIW nozzle 4c, and the gas nozzle 4d are integrated as the nozzle unit 4, a vector indicating a direction in which the pre-wet liquid PW is discharged from the discharge port of the pre-wet nozzle 4a, and a vector indicating a direction in which the deionized water R is discharged from the discharge port of the DIW nozzle 4c also have components whose directions are the same as the rotation direction of the wafer W. Thus, even if the developing liquid D is supplied onto a wafer W having thereon a water-repellent resist film, the surface of the wafer W can be coated with the developing liquid D because the developing liquid D will not be repelled on the surface of the wafer W. Similarly, when the pre-wet liquid PW or the deionized water R is supplied, the surface of the wafer W can be coated with the pre-wet liquid PW or the deionized water R without the pre-wet liquid PW or the deionized water R being repelled on the surface of the wafer W.

Figure 8A:
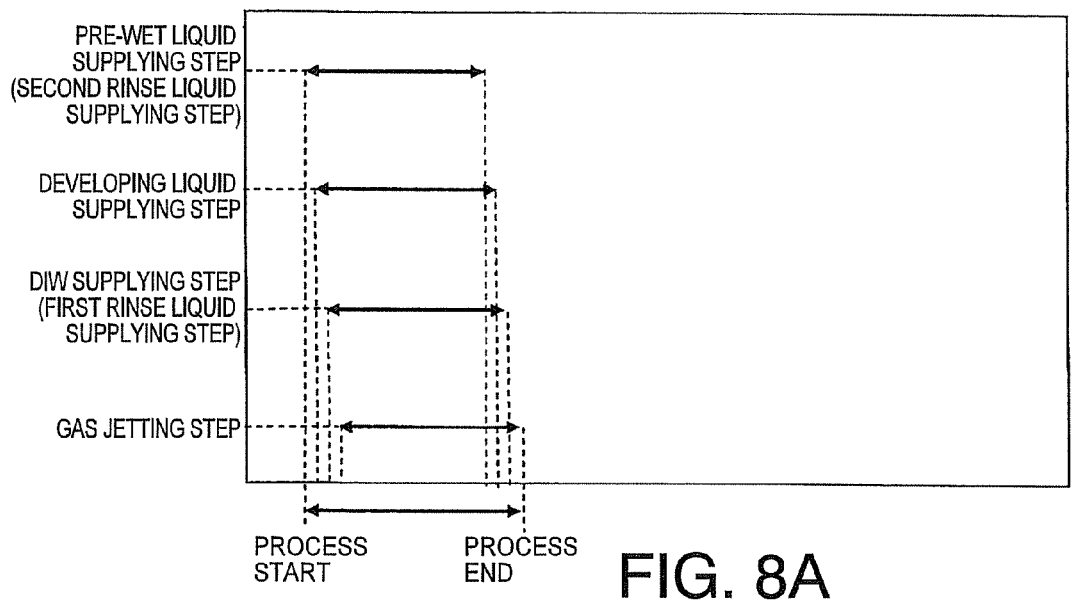
FIG. 8 is a time chart showing the process step of the developing method in one embodiment of the present invention, in comparison with a conventional method.
Figure 8B:
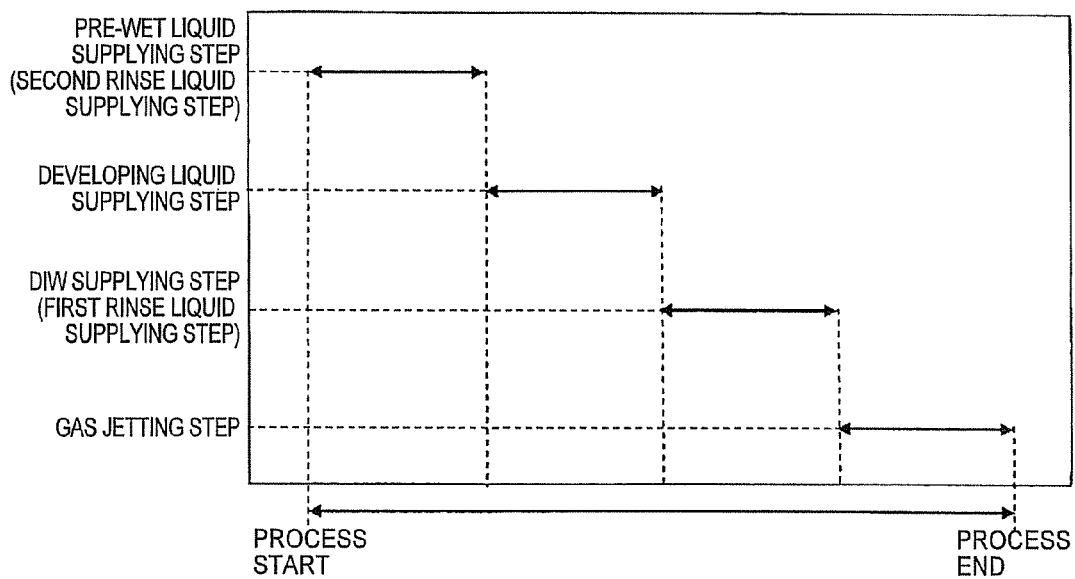

With reference to FIGS. 8A and 8B, the advantage of the foregoing embodiment, reducing the processing time, will be described. FIGS. 8A and 8B are time charts showing the process steps of the developing method in this embodiment, in comparison with a conventional method. FIG. 8A is a time chart showing the process step of the developing method in this embodiment, and FIG. 8B is a time chart showing the process step of the conventional developing method.

As shown in FIG. 8B, the conventional developing method comprises: a pre-wet liquid supplying step that supplies a pre-wet liquid onto a rotating wafer W; a developing liquid supplying step that supplies a developing liquid onto the rotating wafer, a DIW supplying step that supplies deionized water to the wafer so as to rinse the same, and a gas jetting step that jets a gas onto the wafer W to thereby dry the rinse liquid of the deionized water so as to dry the wafer. These steps are independently and sequentially performed. For example, the pre-wet liquid supplying step is firstly performed for 1 to 5 seconds, then the developing liquid supplying step is performed for 10 to 60 seconds, then the DIW supplying step is performed for 10 to 30 seconds, and finally the gas jetting step is performed for 10 to 15 seconds. Thus, it takes 31 to 100 seconds for all the steps to be performed.

On the contrary, as shown in FIG. 8A, the developing method in this embodiment is characterized in that the pre-wet liquid supplying step, the developing liquid supplying step, the DIW supplying step, and the gas jetting step are performed concurrently.

Although it is necessary to adjust the moving velocity of the nozzle 4 between the central portion of the wafer W and the peripheral portion thereof, the developing method in this embodiment can approximately equalize the amount of the developing liquid per unit area in respective portions of the wafer, if the time required for moving the nozzle 4 from the center to the periphery of the wafer W is the same as the time required for performing the developing liquid supplying step in the conventional developing method. In the developing method in this embodiment, by reducing the spacing between the pre-wet nozzle 4a, the developer nozzle 4b, the DIW nozzle 4c, and the gas nozzle 4d, the pre-wet liquid supplying step, the DIW supplying step, and the gas jetting step can be completed at substantially the same time as the completion of the DIW supplying step when the nozzle 4 reaches the periphery of the wafer W. Thus, a time corresponding to the total time required for the pre-wet liquid supplying step, the DIW supplying step and the gas jetting step in the conventional developing method can be reduced, and thus the total process time can be shortened. Therefore, as shown in FIGS. 8A and 8B, the conventional developing method requires a time as long as 31 to 110 seconds, while the developing method in this embodiment requires only 20 to 40 seconds. Namely, the developing time can be shortened.

Further, in the conventional developing method, the developer nozzle 4b is positioned above the approximate center of the surface of the wafer W, and the developing liquid is supplied onto the approximate center of the surface of the wafer W. Thus, the peripheral portion of the wafer W is covered with the developing liquid, by rotating the wafer W so that the developing liquid supplied to the center of the surface of the wafer W spreads by the centrifugal force from the central portion of the wafer W toward the peripheral portion thereof. However, when a highly water-repellent resist is used, since the developing liquid spreading by the centrifugal force is repelled on the resist surface, it is difficult for all the areas to be uniformly covered with the developing liquid.

On the other hand, in the developing method in this embodiment, the developing liquid is supplied onto the wafer W in a spiral form from the discharge port of the developer nozzle 4b from the central portion to the peripheral portion of the wafer W and is directly supplied to all the areas of the wafer W. Thus, even in a case where a resist protection film or a water-repellent resist film is used, since the developing liquid discharged from the discharge port is supplied directly to all the areas of the wafer W, all the areas can be uniformly covered with the developing liquid, without the developing liquid being repelled from the surface of the water-repellent film, whereby the developing process proceeds uniformly in all the areas. Thus, the developing result equivalent to that of the conventional developing method can be achieved, although the processing time is shorter than the conventional method.

In this embodiment, although the moving velocity of the developer nozzle 4b, which is moved integrally with the pre-wet nozzle 4a, the DIW nozzle 4c, and the gas nozzle 4d, decreases as the developer nozzle 4b is moved from the central portion of the wafer W to the peripheral portion thereof, the developer nozzle 4b may be moved at a constant moving velocity from the central portion of the wafer W to the peripheral portion thereof. It is not necessary to decrease the moving velocity of the developer nozzle 4b as the developer nozzle 4b is moved from the central portion of the wafer W to the peripheral portion thereof, if the amount of the developing liquid to be supplied is adjusted such that a sufficient amount of the developing liquid for the developing process is supplied to the outermost portion of the wafer W where the amount of the developing liquid supplied thereto is smallest per unit time and per unit area.

In addition, as long as amounts of the developing liquid to be supplied per unit time and per unit area can be equalized in all the areas between the central portion of the wafer W and the peripheral portion thereof, the rotation speed of the wafer and/or the amount of the developing liquid to be discharged per unit time may be varied, instead of varying the moving velocity of the developer nozzle 4b.

In addition, either in a case where the developer nozzle 4b is moved integrally with at least one of the pre-wet nozzle 4a, the DIW nozzle 4c, and the gas nozzle 4d, or in a case where the developer nozzle 4b is moved independently, it is possible to equalize the amount of the developing liquid to be supplied per unit time and per unit area, by decreasing the moving velocity of the developer nozzle 4b as the developer nozzle 4b is moved from the central portion of the wafer W to the peripheral portion thereof. Alternatively, also in a case where the developer nozzle 4b is not moved integrally with at least one of the pre-wet nozzle 4a, the DIW nozzle 4c, and the gas nozzle 4d, it is possible to make equal amounts of the developing liquid to be supplied per unit time and unit area, by decreasing one of the moving velocities of the pre-wet nozzle 4a, the DIW nozzle 4c, and the gas nozzle 4d, as the selected nozzle is moved from the central portion of the wafer W toward the peripheral portion thereof.

First Modification of Embodiment

Figure 9:
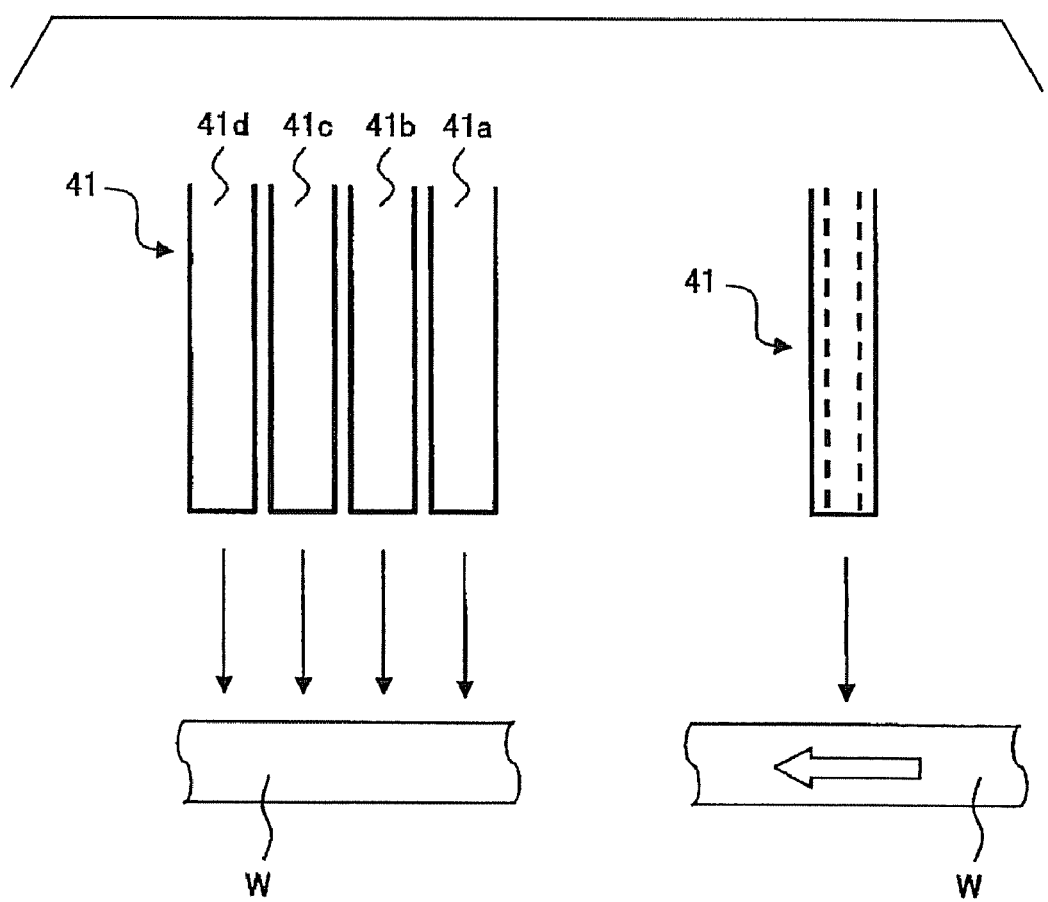
FIG. 9 shows a front view and a side view schematically showing, together with a part of the substrate, the structure of a integrated nozzle unit including a pre-wet nozzle, a developer nozzle, a DIW nozzle and a gas nozzle, for explaining the developing method in a first modification of the embodiment of the present invention.

Next, a first modification of this embodiment will be described with reference to FIG. 9. FIG. 9 shows a front view and a side view schematically showing, together with a part of the substrate, the structure of an integrated nozzle (nozzle unit) including a pre-wet nozzle, a developer nozzle, a DIW nozzle and a gas nozzle, for explaining the developing method in a first modification of this embodiment. The front view is shown on the left side, and the side view is shown on the right side. In the following description, the same reference numbers are given to the parts which have been already described, and explanation thereof is sometimes omitted (this holds true with the subsequent modification).

The developing method in this modification differs from the developing method in the foregoing embodiment in that the vector indicating the direction in which the developing liquid is discharged from the discharge port of the developer nozzle 41b does not have a component whose direction is the same as the rotation direction of the wafer W. Namely, in the developing method in the foregoing embodiment, the vector indicating the direction in which the developing liquid is discharged from the discharge port of the developer nozzle 4b has a component whose direction is the same as a rotation direction of the wafer W. Differently therefrom, in the developing method in this modification, the vector indicating the direction in which the developing liquid is discharged from the discharge port of the developer nozzle 41b is perpendicular to the surface of the wafer W.

A nozzle 41 in this modification includes a pre-wet nozzle 41a, the developer nozzle 41b, a DIW nozzle 41c, and a gas nozzle 41d. Thus, as shown in FIG. 9, not only that the developer nozzle 41b is perpendicular to the surface of the wafer W, but also that all the pre-wet nozzle 41a, the developer nozzle 41b, the DIW nozzle 41c, and the gas nozzle 41d may be perpendicular to the surface of the wafer W.

The developing method in this modification is the same as the developing method in the embodiment, excluding the vector indicating the direction in which the developing liquid discharged from the discharge port.

The description of the foregoing embodiment recites that, if the developing liquid is supplied perpendicularly to the surface of a substrate having thereon a highly water-repellent resist film, the developing liquid is repelled from the substrate surface, and thus the substrate surface cannot be coated with the developing liquid.

However, in a case where the water repellency of the resist film on the substrate is not so high, if the amount of the developing liquid to be supplied to the wafer W is relatively smaller and thus the developing liquid falls onto the wafer W weakly, or if the distance from the discharge port of the developer nozzle 41b to the surface of the wafer W is small and thus the developing liquid falls onto to the wafer W weakly, the developing liquid is not likely to be repelled from the substrate surface. Thus, as shown in FIG. 9, a vector indicating the direction in which the developing liquid is discharged from the discharge port of the developer nozzle 41b may be perpendicular to the surface of the wafer W.

Second Modification of Embodiment

Figure 10:
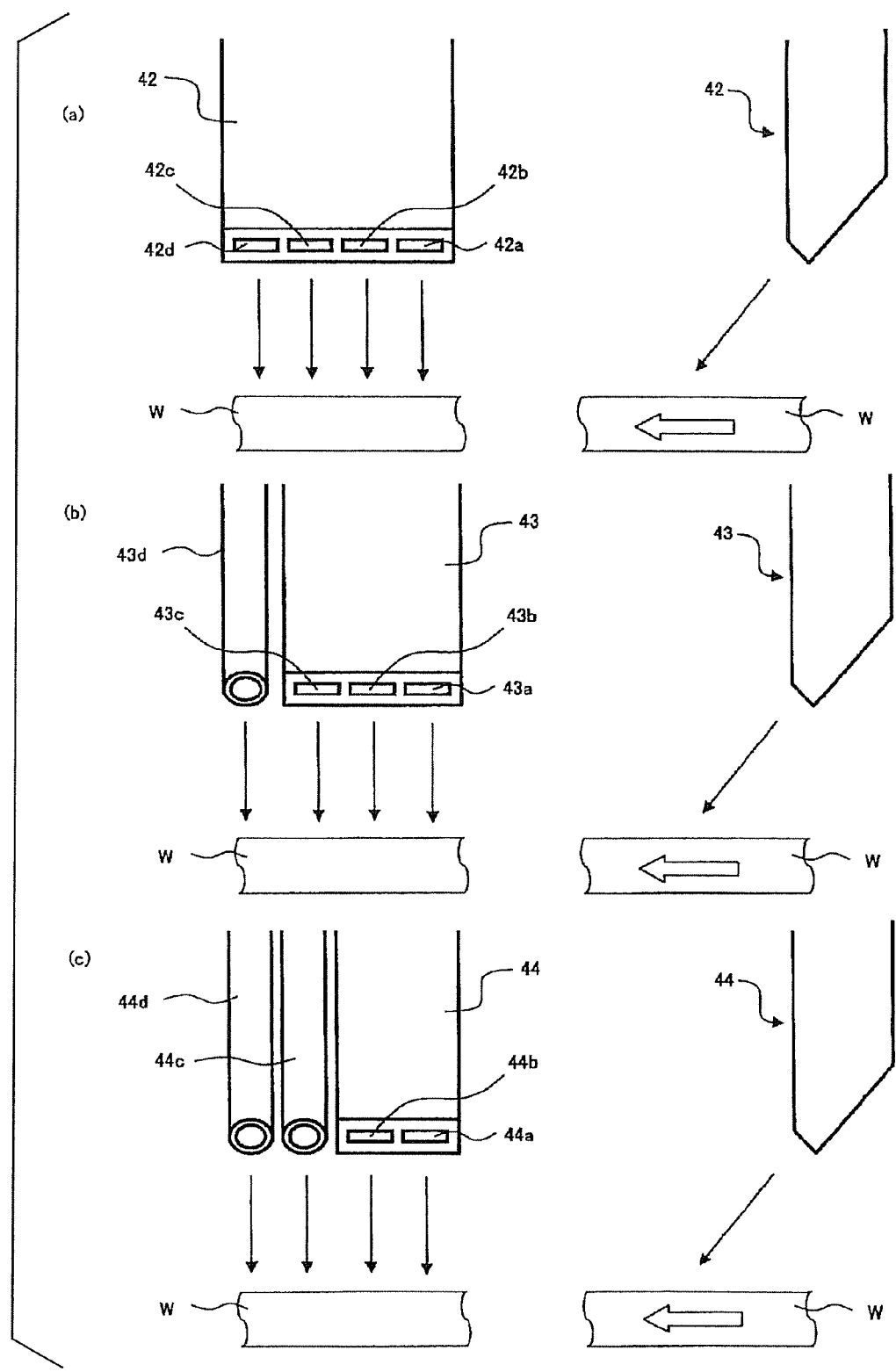
FIG. 10 shows a front view and a side view schematically showing, together with a part of the substrate, the structure of a integrated nozzle unit including a pre-wet nozzle, a developer nozzle, a DIW nozzle and a gas nozzle, for explaining the developing method in a second modification of the embodiment of the present invention.

Next, a second modification of the foregoing embodiment will be described with reference to FIG. 10. FIG. 10 shows a front view and a side view schematically showing, together with a part of the substrate, the structure of an integrated nozzle (nozzle unit) including a pre-wet nozzle, a developer nozzle, a DIW nozzle and a gas nozzle, for explaining the developing method in the second modification of the foregoing embodiment of the present invention. The front views are shown on the left side, and the side views are shown on the right side. FIG. 10(a) show an example of this modification, and FIGS. 10(b) and 10(c) show other examples of this modification.

As shown in FIG. 10(a), the developing method in this modification differs from the developing method in the foregoing embodiment in that the discharge port of the developer nozzle has an elongated rectangular shape. Namely, in the developing method in the foregoing embodiment, the discharge port of the developer nozzle has a circular shape. Differently therefrom, in the developing method in this modification, the discharge port of the developer nozzle has an elongated rectangular shape.

The developing method in this modification is the same as the developing method in the foregoing embodiment, excluding that the discharge port has an elongated rectangular shape.

As shown in the front view on the left side of FIG. 10(a), a nozzle 42 is formed as an integrated unit including a pre-wet nozzle, a developer nozzle, a DIW nozzle, and a gas nozzle. Namely, the nozzle 42 includes four discharge ports, i.e., a pre-wet liquid discharge port 42a, a developer discharge port 42b, a DIW discharge port 42c, and a gas discharge port 42d. Each of the four discharge ports, i.e., the pre-wet liquid discharge port 42a, the developer discharge port 42b, the DIW discharge port 42c and the gas discharge port 42d, has a rectangular shape. The four discharge ports, i.e., the pre-wet discharge port 42a, the developer discharge port 42b, the DIW discharge port 42c, and the gas discharge port 42d, are arranged such that longer sides of the respective discharge ports having a rectangular shape are arranged along the radial direction of the wafer W. As shown in the front view on the left side of FIG. 10(a), the nozzle 42 may be formed as an integrated unit including the pre-wet nozzle, the developer nozzle, the DIW nozzle, and the gas nozzle.

Each of the rectangular discharge ports has a slit-like shape having a longer side ranging between 8 and 15 mm, and a shorter side ranging between 0.1 and 1 mm, preferably, 0.1 and 0.5 mm.

The arrangement in which the longer sides of discharge ports having a rectangular shape are located along the radial direction of the wafer W includes an arrangement in which the longer sides of the discharge pots intersect a line (radius) from the center of the wafer W toward the periphery thereof at a certain angle, as well as an arrangement in which the longer sides of the discharge ports extend along a line (radius) from the center of the wafer W toward the periphery thereof. Further, the "rectangular shape" may be an approximately rectangular shape, and it is not necessary that a horizontal cross-section has a strictly (exactly) rectangular shape. For example, the discharge port may have a trapezoidal cross-section or the respective sides of the discharge port may be corrugated.

Since the longer sides of the discharge ports having a rectangular shape are arranged along the radial direction of the wafer W, it is possible to make uniform the supply amount of a process liquid, such as a developing liquid, which is discharged from the discharge ports and falls onto the surface of the wafer W, per unit length along the radial direction of the wafer W, whereby the developing process can be performed with the use of the substantially uniform supply amounts of the process liquid that is supplied to any position on the overall surface of the wafer W. As a result, the developing process can be efficiently performed by using a predetermined amount of process liquid such as a developing liquid, whereby in-plane uniformity of the CD value can be improved as well as a processing time can be shortened.

As shown in the side view of FIG. 10(*a*), the vector indicating the direction in which the developing liquid is discharged from the developer discharge port 42*b* of the nozzle 42 has a component whose direction is the same as a rotation direction of the wafer W. In addition, since the pre-wet nozzle, the developer nozzle, the DIW nozzle, and the gas nozzle are integrated as the nozzle 42, the vector indicating the direction in which the pre-wet liquid is discharged from the pre-wet discharge port 42*a*, and the vector indicating the direction in which deionized water is discharged from the DIW discharge port 42*c* also have components whose directions are the same as the rotation direction of the wafer W. Thus, even when the developing liquid is supplied onto a wafer W having thereon a highly water-repellent resist film, the surface of the wafer W can be coated with the developing liquid because the developing liquid will not be repelled from the surface of the wafer W. Similarly, when the pre-wet liquid or the deionized water is supplied, the surface of the wafer W can be coated with the pre-wet liquid or the deionized water without the pre-wet liquid or the deionized water being repelled from the surface of the wafer W.

Moreover, as shown in FIGS. 10(*b*) and 10(*c*), in this modification, a nozzle formed as an integrated unit including a plurality of nozzles each having a discharge port having a rectangular shape, and a nozzle having a discharge port of a circular shape, may be used in combination. FIG. 10(*b*) shows a modification in which a nozzle 43 including three discharge ports having a rectangular shape, i.e., a pre-wet discharge port 43*a*, a developer discharge port 43*b*, and a DIW discharge port 43*c*, and a gas nozzle 43*d* having a discharge port of a circular shape are combined. FIG. 10(*c*) shows a modification in which a nozzle 44 including two discharge ports having a rectangular shape, i.e., a pre-wet discharge port 44*a* and a developer discharge port 44*b*, a DIW nozzle 44*c* having a discharge port of a circular shape, and a gas nozzle 44*d* having a discharge port of a circular shape, are combined.

In cases where the nozzles shown in FIGS. 10(*b*) and 10(*c*) are used, longer sides of the developer discharge ports 43*b* and 44*b* are arranged along a radial direction of the wafer W. Thus, it is possible to make uniform the supply amounts of developing liquids, which are discharged from the discharge ports 43*b* and 44*b* and fall onto the surface of the wafer W, per unit length along the radial direction of the wafer W, whereby the developing process can be performed with the use of the substantially uniform supply amounts of the developing liquid that is supplied to any position on the overall surface of the wafer W. As a result, the developing process can be efficiently performed by using a predetermined amount of the developing liquid, whereby in-plane uniformity of the CD value can be improved and also the processing time can be shortened.

Similarly to the nozzle shown in FIG. 10(*a*), in the nozzle shown in FIG. 10(*b*), the vector indicating the direction in which the developing liquid is discharged from the developer discharge port 43*b* of the nozzle 43 has a component whose direction is the same as the rotation direction of the wafer W. In addition, in FIG. 10(*b*), since the pre-wet nozzle, the developer nozzle, the DIW nozzle, and the gas nozzle are integrated as the nozzle 43, the vector indicating the direction in which the pre-wet liquid is discharged from the pre-wet discharge port 43*a*, and the vector indicating the direction in which deionized water is discharged from the DIW discharge port 43*c* also have components whose directions are the same as the rotation direction of the wafer W. Thus, even when a developing liquid is supplied onto a wafer W having thereon a highly water-repellent resist film, the surface of the wafer W can be coated with the developing liquid because the developing liquid D will not be repelled from the surface of the wafer W. Similarly, when a pre-wet liquid or deionized water is supplied, the surface of the wafer W can be coated with the pre-wet liquid or the deionized water without the pre-wet liquid or the deionized water being repelled from the surface of the wafer W.

Similarly to the nozzle shown in FIG. 10(*a*), in the nozzle shown in FIG. 10(*c*), the vector indicating the direction in which a developing liquid is discharged from the developer discharge port 44*b* of the nozzle 44 has the component whose direction is the same as the rotation direction of the wafer W. In addition, in FIG. 10(*c*), since the pre-wet nozzle, the developer nozzle, the DIW nozzle, and the gas nozzle are integrated as the nozzle 44, the vector indicating the direction in which the pre-wet liquid is discharged from the pre-wet discharge port 44*a*, and the vector indicating the direction in which deionized water is discharged from the DIW discharge port 44*c* also have components whose directions are the same as the rotation direction of the wafer W. Thus, even when a developing liquid is supplied onto a wafer W having thereon a highly water-repellent resist film, the surface of the wafer W can be coated with the developing liquid because the developing liquid D will not be repelled from the surface of the wafer W. Similarly, when a pre-wet liquid or deionized water is supplied, the surface of the wafer W can be coated with the pre-wet liquid or the deionized water without the pre-wet liquid or the deionized water being repelled from the surface of the wafer W.

Although the preferred embodiment of the present invention has been described above, the present invention is not limited to the foregoing specific embodiment. The present invention may be variously modified and changed within the scope of the claims of the present invention.

The invention claimed is:

1. A developing method for developing a substrate, said method comprising:
   providing a substrate having a surface coated with a resist that has been exposed;
   rotating the substrate about a vertical axis while holding the substrate horizontally;
   supplying a developing liquid from a discharge port of a developer nozzle onto the surface of the rotating substrate, while moving the developer nozzle, disposed above the rotating substrate, from a central portion towards a peripheral portion of the rotating substrate; and supplying a first rinse liquid from a discharge port of a first rinse nozzle onto the surface of the rotating substrate, while moving the first rinse nozzle, disposed above the rotating substrate, from the central portion towards the peripheral portion of the rotating substrate;

wherein the supplying of the developing liquid and the supplying of the first rinse liquid are performed concurrently, while the first rinse nozzle is maintained nearer to a center of the rotating substrate than the developer nozzle.

2. The method according to claim 1, further comprising:
jetting a gas from a discharge port of a gas nozzle onto the surface of the rotating substrate, while moving the gas nozzle, disposed above the rotating substrate, from the central portion towards the peripheral portion of the rotating substrate, wherein the jetting of the gas and the supplying of the first rinse liquid are performed concurrently, while the gas nozzle is maintained nearer to the center of the rotating substrate than the first rinse nozzle.

3. The method according to claim 2, further comprising:
supplying a second rinse liquid from a discharge port of a second rinse nozzle onto the surface of the rotating substrate, while moving the second rinse nozzle, disposed above the rotating substrate, from the central portion towards the peripheral portion of the rotating substrate, wherein the supplying of the developing liquid and the supplying of the second rinse liquid are performed concurrently, while the developer nozzle is maintained nearer to the center of the rotating substrate than the second rinse nozzle.

4. The method according to claim 3, wherein the first rinse nozzle and the developer nozzle move as a unit.

5. The method according to claim 3, wherein the gas nozzle and the first rinse nozzle move as a unit.

6. The method according to claim 3, wherein the developer nozzle and the second rinse nozzle move as a unit.

7. The method according to claim 3, wherein moving velocity of the developer nozzle decreases as the developer nozzle approaches a periphery of the rotating substrate.

8. The method according to claim 3, wherein a vector indicating a direction in which the developing liquid is discharged from the developer nozzle has a component whose direction is the same as a rotation direction of the rotating substrate.

9. The method according to claim 2, wherein the first rinse nozzle and the developer nozzle move as a unit.

10. The method according to claim 2, wherein the gas nozzle and the first rinse nozzle move as a unit.

11. The method according to claim 2, wherein moving velocity of the developer nozzle decreases as the developer nozzle approaches a periphery of the rotating substrate.

12. The method according to claim 2, wherein a vector indicating a direction in which the developing liquid is discharged from the developer nozzle has a component whose direction is the same as a rotation direction of the rotating substrate.

13. The method according to claim 1, further comprising:
supplying a second rinse liquid from a discharge port of a second rinse nozzle onto the surface of the rotating substrate, while moving the second rinse nozzle, disposed above the rotating substrate, from the central portion towards the peripheral portion of the rotating substrate, wherein the supplying of the developing liquid and the supplying of the second rinse liquid are performed concurrently, while the developer nozzle is maintained nearer to the center of the rotating substrate than the second rinse nozzle.

14. The method according to claim 13, wherein the first rinse nozzle and the developer nozzle move as a unit.

15. The method according to claim 13, wherein the developer nozzle and the second rinse nozzle move as a unit.

16. The method according to claim 13, wherein moving velocity of the developer nozzle decreases as the developer nozzle approaches a periphery of the rotating substrate.

17. The method according to claim 13, wherein a vector indicating a direction in which the developing liquid is discharged from the developer nozzle has a component whose direction is the same as a rotation direction of the rotating substrate.

18. The method according to claim 1, wherein the first rinse nozzle and the developer nozzle move as a unit.

19. The method according to claim 1, wherein moving velocity of the developer nozzle decreases as the developer nozzle approaches a periphery of the rotating substrate.

20. The method according to claim 1, wherein a vector indicating a direction in which the developing liquid is discharged from the developer nozzle has a component whose direction is the same as a rotation direction of the rotating substrate.

* * * * *